(12) United States Patent
Schmid et al.

(10) Patent No.: US 10,081,533 B2
(45) Date of Patent: Sep. 25, 2018

(54) MICROMECHANICAL STRUCTURE AND METHOD FOR FABRICATING THE SAME

(71) Applicant: Infineon Technologies AG, Neubiberg (DE)

(72) Inventors: Ulrich Schmid, Vienna (AT); Tobias Frischmuth, Vienna (AT); Peter Irsigler, Obernberg/Inn (AT); Thomas Grille, Villach (AT); Daniel Maurer, Feld am See (AT); Ursula Hedenig, Villach (AT); Markus Kahn, Rangersdorf (AT); Günter Denifl, Annenheim (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 1027 days.

(21) Appl. No.: 14/448,767

(22) Filed: Jul. 31, 2014

(65) Prior Publication Data

US 2016/0031701 A1    Feb. 4, 2016

(51) Int. Cl.
*B81B 3/00* (2006.01)
*B06B 1/02* (2006.01)
(Continued)

(52) U.S. Cl.
CPC .............. *B81B 3/0021* (2013.01); *B06B 1/02* (2013.01); *B81B 3/007* (2013.01); *B81C 1/0015* (2013.01);
(Continued)

(58) Field of Classification Search
CPC ................ B81B 3/0021; B81B 3/007; B81B 2201/0257; B81B 2201/0264;
(Continued)

(56) References Cited

U.S. PATENT DOCUMENTS

| | | | |
|---|---|---|---|
| 2004/0248344 | A1 | 12/2004 | Partridge et al. |
| 2004/0266050 | A1 | 12/2004 | Benzel et al. |

(Continued)

FOREIGN PATENT DOCUMENTS

| | | |
|---|---|---|
| CN | 101600134 A | 12/2009 |
| CN | 102638753 A | 8/2012 |

(Continued)

OTHER PUBLICATIONS

Machine translation of CN 103916800 A.*
(Continued)

*Primary Examiner* — John K Kim
*Assistant Examiner* — Minki Chang
(74) *Attorney, Agent, or Firm* — Slater Matsil, LLP

(57) ABSTRACT

A micromechanical structure includes a substrate and a functional structure arranged at the substrate. The functional structure has a functional region configured to deflect with respect to the substrate responsive to a force acting on the functional region. The functional structure includes a conductive base layer and a functional structure comprising a stiffening structure having a stiffening structure material arranged at the conductive base layer and only partially covering the conductive base layer at the functional region. The stiffening structure material includes a silicon material and at least a carbon material.

39 Claims, 16 Drawing Sheets

(51) Int. Cl.
  *B81C 1/00* (2006.01)
  *H04R 19/02* (2006.01)
  *H04R 19/04* (2006.01)
  *H04R 31/00* (2006.01)
  *H04R 7/24* (2006.01)
  *H04R 7/02* (2006.01)
  *H04R 19/00* (2006.01)

(52) U.S. Cl.
  CPC ...... *B81C 1/00142* (2013.01); *B81C 1/00158* (2013.01); *B81C 1/00373* (2013.01); *H04R 7/02* (2013.01); *H04R 7/24* (2013.01); *H04R 19/005* (2013.01); *H04R 19/02* (2013.01); *H04R 19/04* (2013.01); *H04R 31/00* (2013.01); *H04R 31/003* (2013.01); *B81B 2201/0257* (2013.01); *B81B 2201/0264* (2013.01); *B81B 2203/0109* (2013.01); *B81B 2203/0118* (2013.01); *B81B 2203/0127* (2013.01); *B81B 2203/051* (2013.01); *B81C 2201/019* (2013.01); *B81C 2201/0176* (2013.01); *B81C 2201/0181* (2013.01); *H04R 2201/003* (2013.01); *H04R 2307/023* (2013.01); *H04R 2400/01* (2013.01); *H04R 2499/11* (2013.01)

(58) Field of Classification Search
  CPC ..... B81B 2203/0109; B81B 2203/0118; B81B 2203/0127; B81B 2203/051; B81C 1/00142; B81C 1/0015; B81C 1/00158; B81C 1/00373; B81C 2201/0176; B81C 2201/0181; B81C 2201/019; H04R 7/02; H04R 7/024; H04R 19/005; H04R 19/02; H04R 19/04; H04R 31/00; H04R 31/003; H04R 2201/003; H04R 2307/023; H04R 2400/01; H04R 2499/11
  USPC .......................... 310/12.03, 300, 311, 313 R
  See application file for complete search history.

(56) References Cited

U.S. PATENT DOCUMENTS

| | | | |
|---|---|---|---|
| 2005/0046672 A1* | 3/2005 | Cabal | B41J 2/14427 347/54 |
| 2005/0115889 A1 | 6/2005 | Schaevitz et al. | |
| 2005/0139542 A1 | 6/2005 | Dickensheets et al. | |
| 2009/0065429 A9 | 3/2009 | Dickensheets et al. | |
| 2009/0127640 A1 | 5/2009 | Benzel et al. | |
| 2009/0304225 A1* | 12/2009 | Kamimura | H04R 7/127 381/423 |
| 2010/0060102 A1* | 3/2010 | Goto | H03H 9/0222 310/313 B |
| 2011/0089505 A1 | 4/2011 | Schneider et al. | |
| 2013/0062710 A1* | 3/2013 | Dehe | G01L 9/0016 257/415 |
| 2013/0264663 A1 | 10/2013 | Dehe et al. | |
| 2014/0037116 A1 | 2/2014 | Friza et al. | |

FOREIGN PATENT DOCUMENTS

| | | | |
|---|---|---|---|
| CN | 203206466 U | | 9/2013 |
| CN | 103916800 A | * | 7/2014 |
| DE | 10138759 A1 | | 3/2003 |
| DE | 102004036035 A1 | | 7/2005 |
| DE | 102009044980 A1 | | 3/2011 |
| DE | 102010062555 A1 | | 6/2012 |
| DE | 102011080125 A1 | | 1/2013 |
| DE | 102012216150 A1 | | 3/2013 |
| DE | 102013205527 A1 | | 10/2013 |
| JP | 2011173185 A | | 9/2011 |
| KR | 1020060015633 A | | 2/2006 |
| KR | 1020060132810 A | | 12/2006 |
| WO | 2013017313 A1 | | 2/2013 |

OTHER PUBLICATIONS

Schmid, U., et al., "Etching characteristics and mechanical properties of a-SiC:H thin films," Sensors and Actuators A 94, Jul. 2, 2001, pp. 87-94.

* cited by examiner

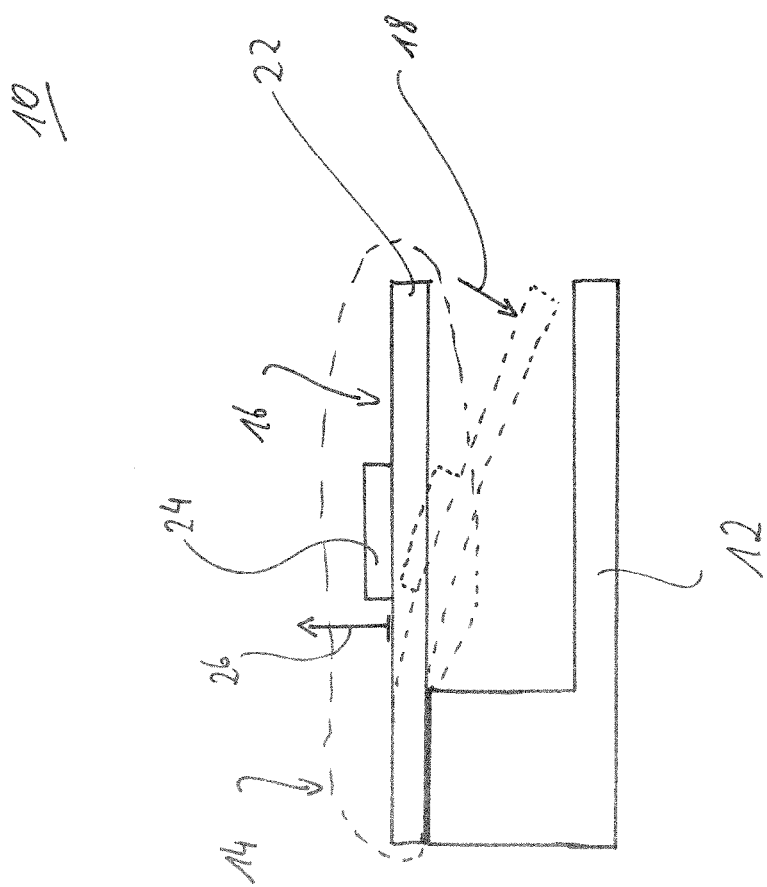

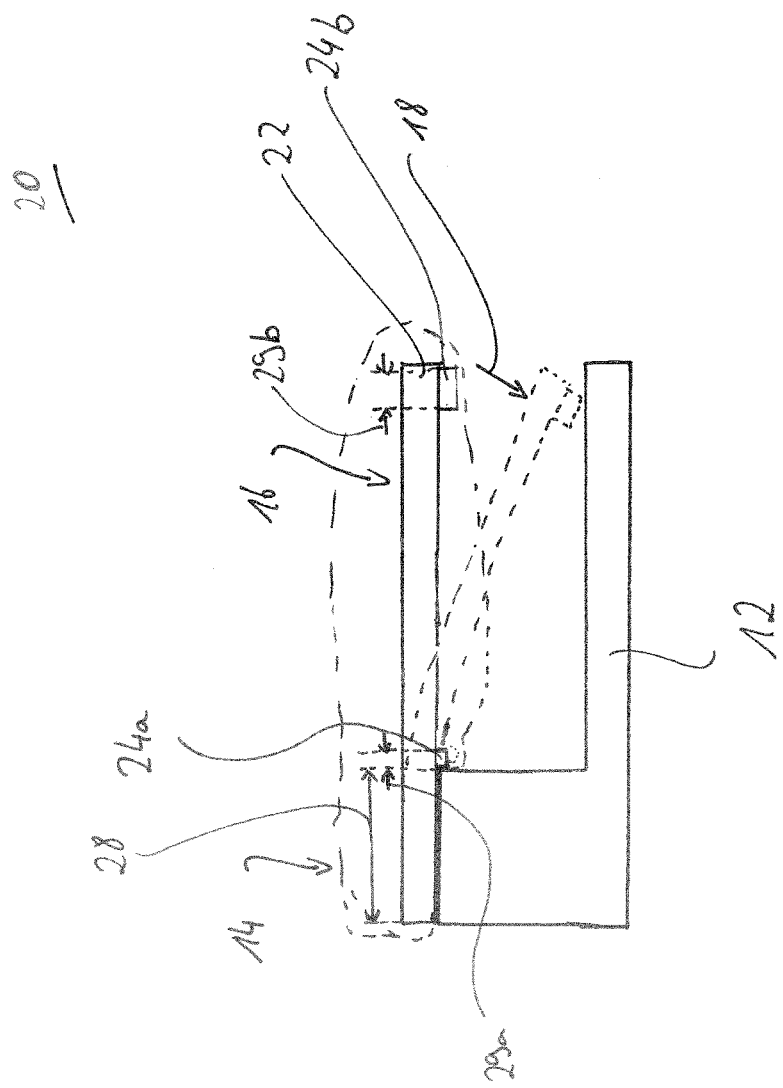

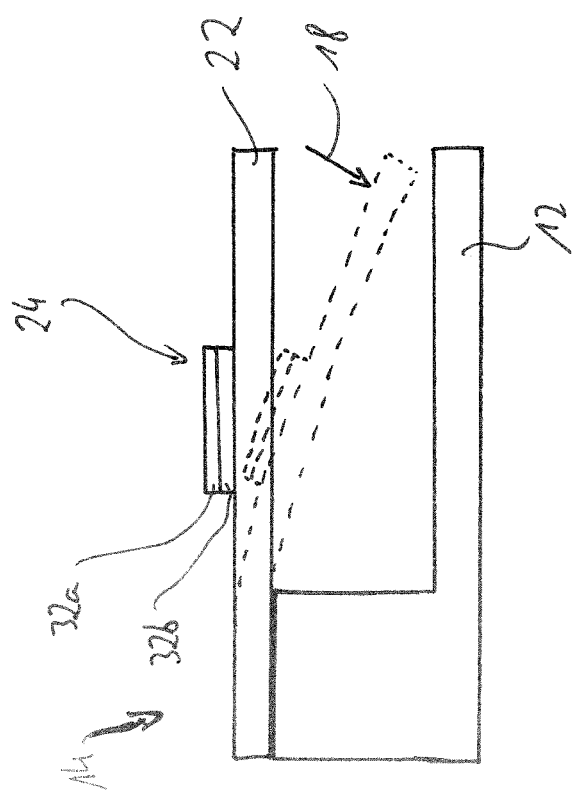

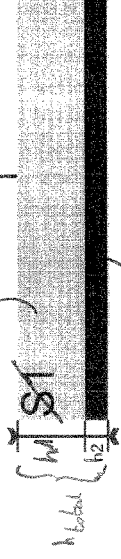
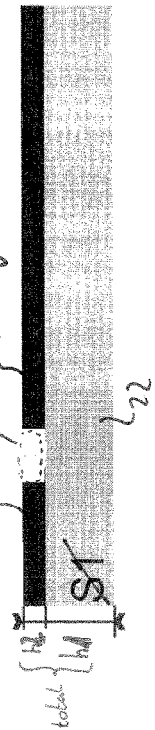
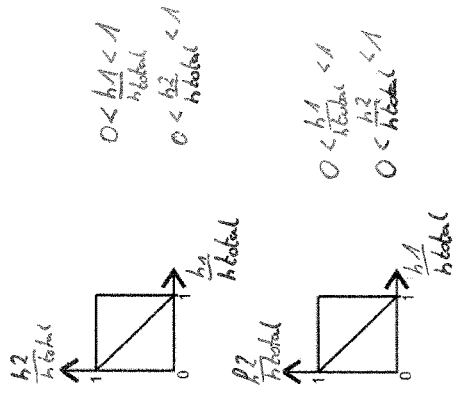

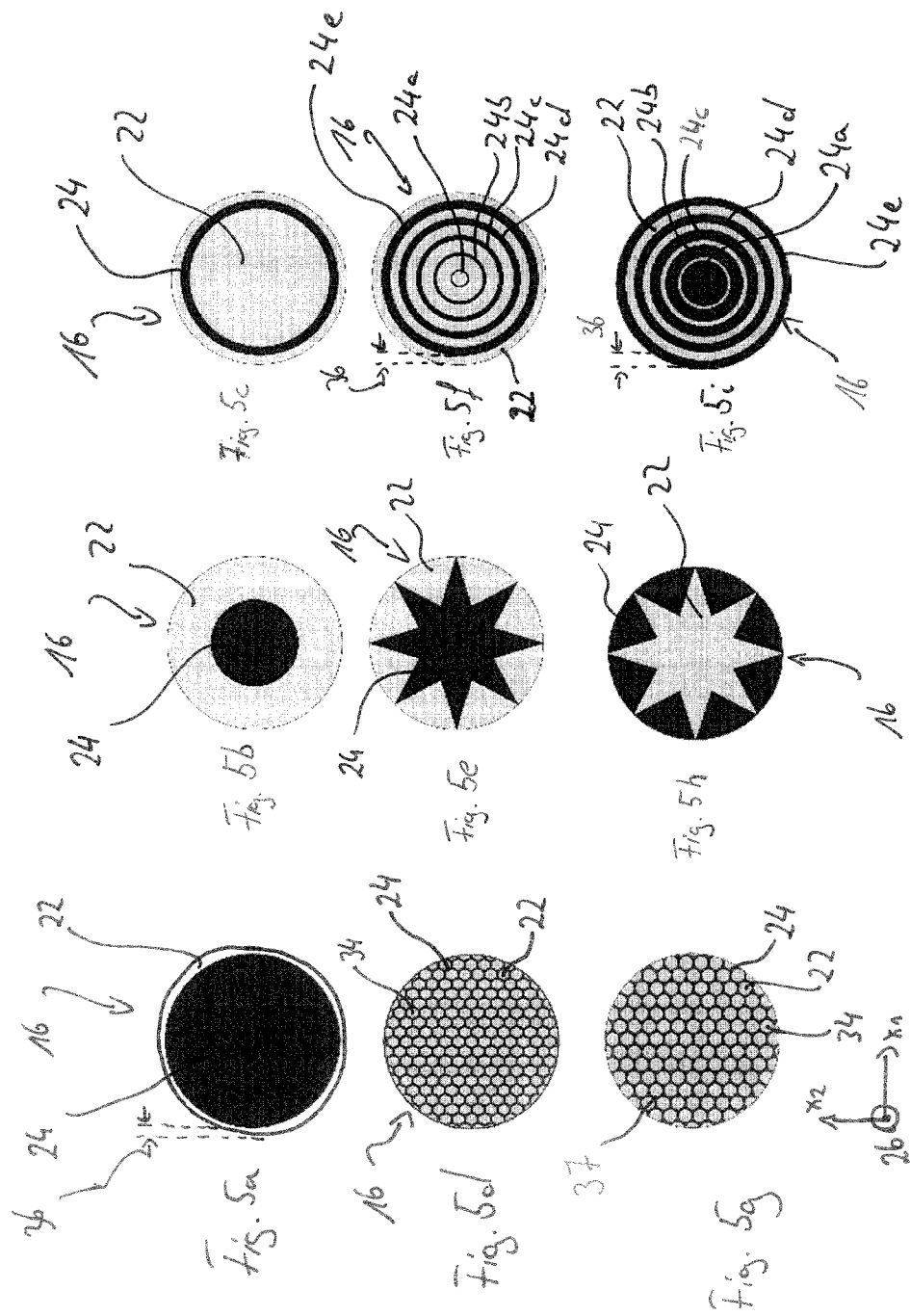

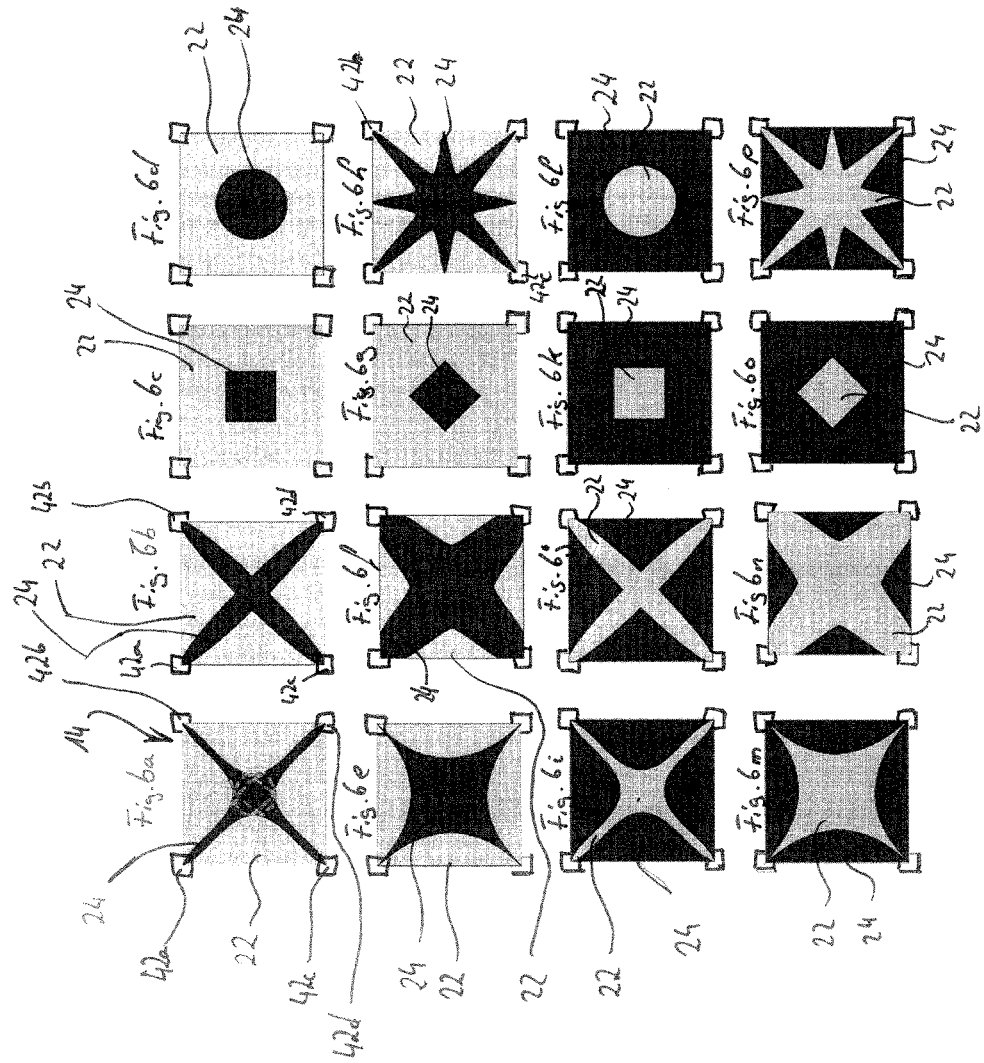

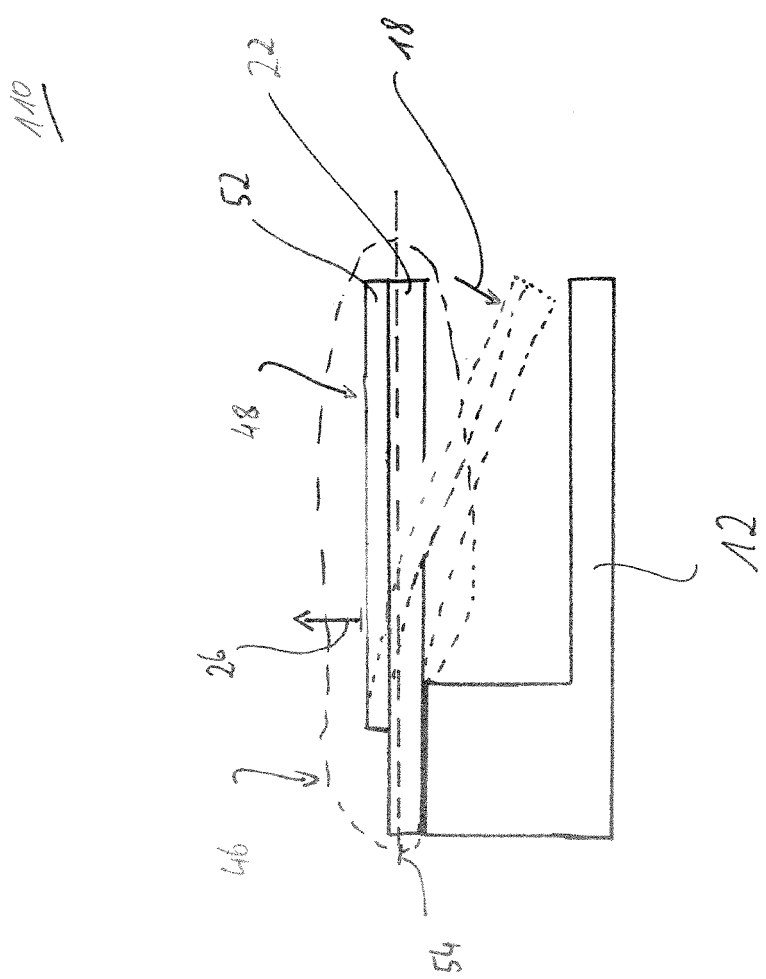

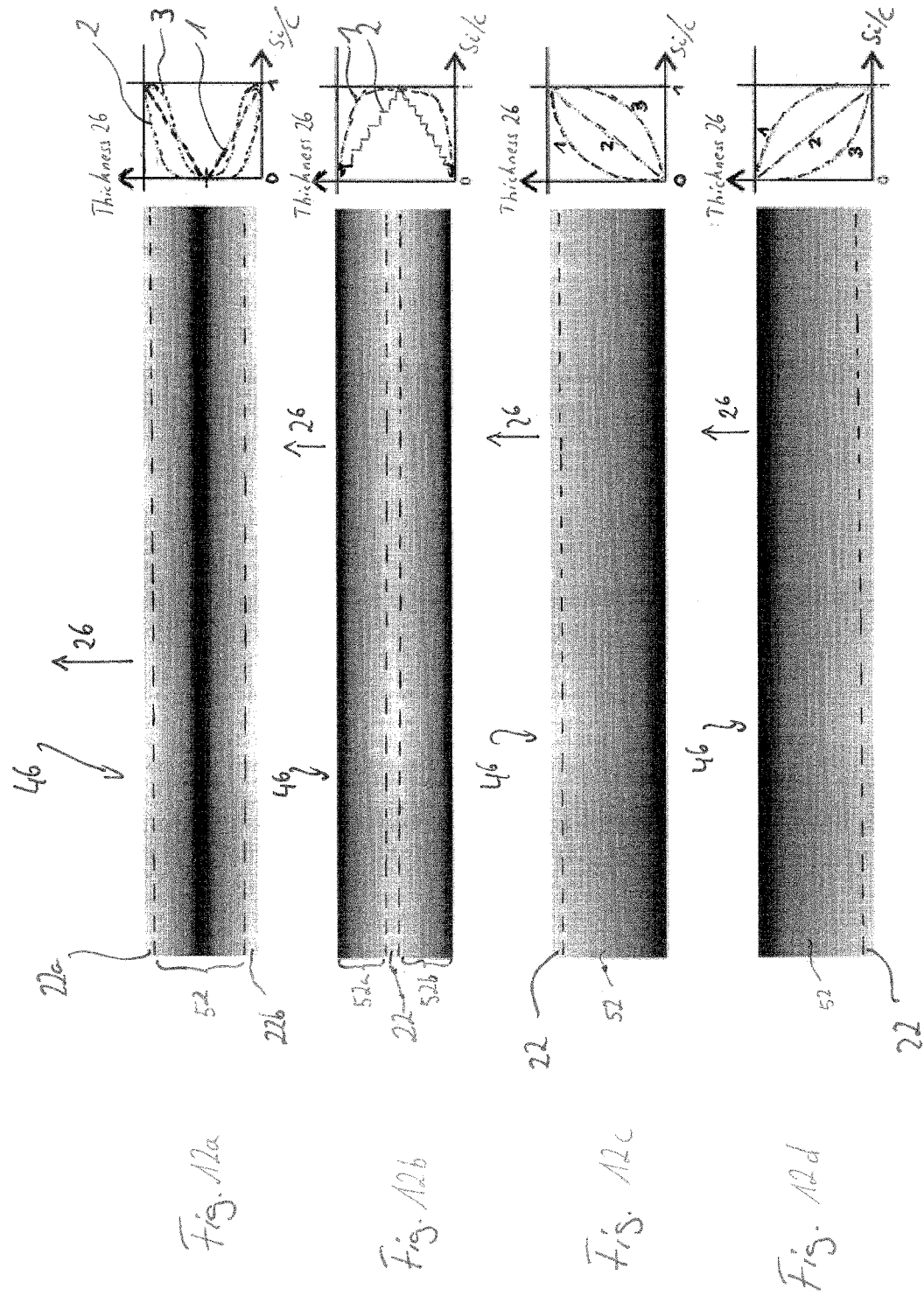

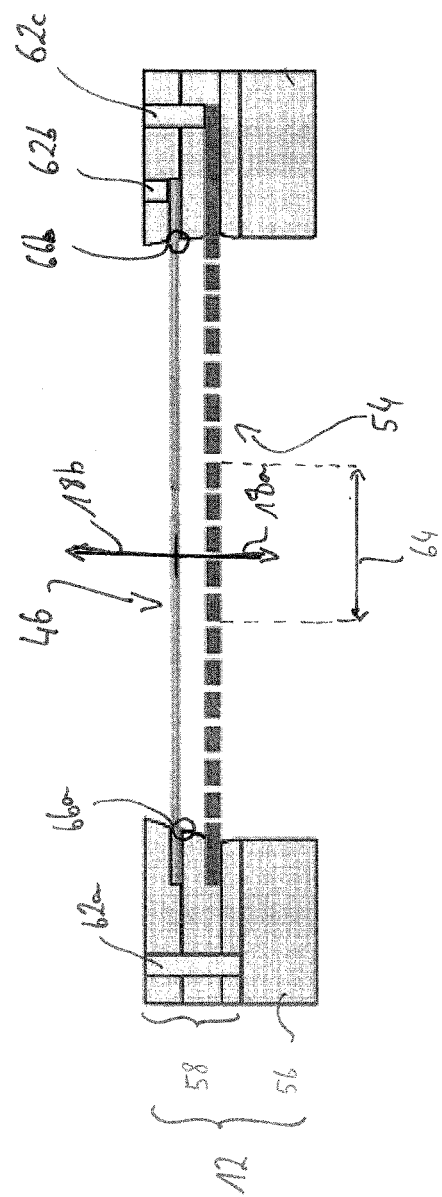

MICROMECHANICAL STRUCTURE AND METHOD FOR FABRICATING THE SAME

TECHNICAL FIELD

The invention relates to micro mechanical structures. The invention further relates to a conductive and robust micro electromechanical structure thin film via silicon-carbon-oxygen-nitrogen multilayer membranes.

BACKGROUND

The term micro electromechanical system (MEMS) or micro mechanical system/structure is often used to refer to small integrated devices or systems that combine electrical and mechanical components. When focusing on the micro mechanical parts, the term "micro mechanical system" may be used to describe small integrated devices or systems which comprises one or more micro mechanical elements and possibly, but not necessarily, electrical components and/or electronic components.

Micro mechanical systems may be used as, for example, actuators, transducers or sensors, e.g. pressure sensors. Pressure sensors are nowadays mass products in automobile electronics and consumer goods electronics. For many of these applications, systems are used in which the sensor is integrated in an application-specific integrated circuit (ASIC). For example, Infineon Technologies AG offers such a system as a side-airbag sensor.

In particular, the mechanically active elements of a micro mechanical system may typically require relatively complex structures, such as recesses, beams, cantilevers, undercuts, cavities etc. Possibly, a relatively high number of manufacturing steps are required. Furthermore, the process used for performing the micro mechanical system may need to be compatible with possible subsequent manufacturing steps that are used for creating electrical and/or electronic components, for example.

Micro mechanical systems or structures (MMS) may comprise deflectable structures such as membranes. A Micro electromechanical structure (MEMS) may comprise one or more micro mechanical structures whose deflectable structure may be deflected electrically (actuator). Alternatively or in addition the MEMS may provide an electrical signal responsive to a deflection of the deflectable structure of the MMS (sensor). Movement of the deflected structure may lead to mechanical stress. Thus, there is a need to provide micro mechanical structures with improved durability and/or deflection performance.

SUMMARY

The inventors have found, that a durability and/or deflection performance of a micro mechanical structure may be improved when a hardness of the deflectable structure is increased by covering the deflectable structure partially with a stiffening material comprising silicon material and carbon material and by covering the deflectable structure at least partially by a stiffening structure comprising a varying concentration of the silicon material and/or the carbon material. A hardness of the stiffening structure may be higher than a hardness of the deflectable structure such that a loadability of the deflectable structure may be increased and/or such that a volume of thereof may be reduced.

Embodiments provide a micromechanical structure comprising a substrate and a functional structure arranged at the substrate. The functional structure comprises a functional region configured to deflect with respect to the substrate responsive to a force acting on the functional region. The functional structure comprises a conductive base layer and a stiffening structure having a stiffening structure material arranged at the conductive base layer and only partially covering the conductive base layer at the functional region. The stiffening structure material comprises a silicon material and at least a carbon material.

Further embodiments provide a micromechanical structure comprising a substrate and a functional structure arranged at the substrate. The functional structure comprises a functional region which is deflectable with respect to the substrate responsive to a force acting on the functional structure. The functional structure comprises a conductive base layer and a stiffening structure having a stiffening structure material covering at least partially the conductive base layer. The stiffening structure material comprises a carbon material comprising a varying carbon concentration along a thickness direction of the stiffening structure.

Further embodiments provide a method for fabricating a micromechanical structure. The method comprises providing a substrate and arranging a functional structure comprising a conductive base layer at the substrate such that the functional structure is deflectable in a functional region with respect to the substrate responsive to a force acting on the functional region. The method further comprises depositing a stiffening structure having a stiffening structure material at the conductive base layer such that the conductive base layer only partially covers the functional region, wherein the stiffening structure material comprises a silicon material and at least a carbon material.

Further embodiments provide a method for fabricating a micromechanical structure. The method comprises providing a substrate and arranging a functional structure comprising a conductive base layer at the substrate such that the functional structure is deflectable in a functional region with respect to the substrate and responsive to a force acting on the functional region. The method further comprises depositing a stiffening structure material comprising a carbon material at the functional structure to form a stiffening structure at the functional structure such that the carbon material comprises a varying carbon concentration along a thickness direction, wherein the stiffening structure covers at least partially the conductive base layer.

BRIEF DESCRIPTION OF THE DRAWINGS

Embodiments of the present invention are described herein making reference to the appended drawings.

FIG. 1 shows a schematic side view of a micromechanical structure comprising a substrate and a functional structure arranged at the substrate, the functional structure having a stiffening structure, wherein the functional structure is a multilayer membrane according to an embodiment;

FIG. 2 shows a schematic side view of a micromechanical structure, with two stiffening structures arranged at the conductive base layer facing the substrate according to a further embodiment;

FIG. 3 shows a schematic side view of a micromechanical structure comprising the substrate and the stiffening structure, wherein the stiffening structure comprises two film structures according to a further embodiment;

FIGS. 4a-d show each a schematic side view of the functional region according to further embodiments;

FIGS. 5a-i show each a schematic top or bottom view of a possible implementation of the functional region according to further embodiments;

FIGS. 6a-p show each a schematic top or bottom view of a functional structures comprising a quadratic conductive base layer that is clamped at clamping regions according to further embodiments;

FIG. 11 shows a schematic cross-sectional view of a micromechanical structure comprising the substrate and a functional structure arranged at the substrate, wherein the functional structure is a gradient membrane according to a further embodiment;

FIGS. 12a-d show schematic side views of the functional structure comprising at least one conductive base layer and at least one stiffening structure. The FIGS. 12a-d further show possible variations of a concentration of the silicon material of the functional structure according to a further embodiment;

FIG. 13 shows a schematic cross-sectional view of a micromechanical structure comprising the functional structure and a back plate electrode according to an embodiment;

DETAILED DESCRIPTION OF ILLUSTRATIVE EMBODIMENTS

Figure 7A:
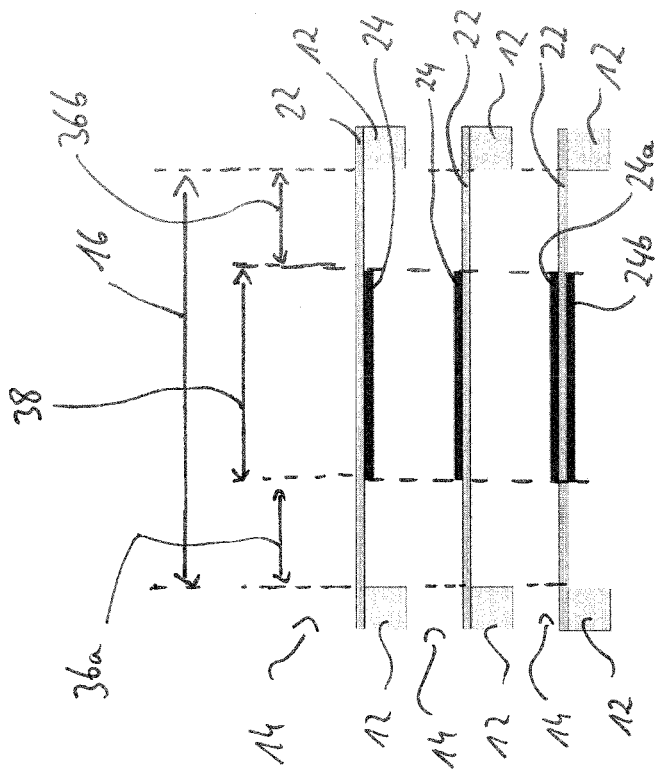
FIG. 7a shows in a top section a schematic side view of the stiffening structure being arranged in an inner region of the conductive base layer at the first side, in a center section a schematic side view of the stiffening structure being arranged at the second side and in a bottom section a schematic side view of the stiffening structure being arranged at the both sides according to a further embodiment.

Before embodiments of the present invention will be described in detail using the accompanying figures, it is to be pointed out that the same or functionally equal elements are given the same reference numbers in the figures and that a repeated description for elements provided with the same or similar reference numbers is typically omitted. Hence, descriptions provided for elements having the same reference numbers are mutually exchangeable and applicable.

Usually, microphones and/or microspeakers realized as MEMS are manufactured in silicon technology. Silicon micromachined microphones are capacitive transducers including a flexible membrane moving in the sound field and a static perforated electrode which is called back plate. In the concept of excessive pressure, the membrane can be subjected to pressure differences up to 10 bar. In such cases, typical membranes fail since their fracture strength, respectively a maximum mechanical load the membrane may tolerate (break resistance) is exceeded.

The complementary transducer is a microspeaker that needs to be actuated such that a large stroke displacement is achieved, for example by a capacitive actuation, to drive a large air displacement and hence acceptable sound pressure.

A deflectable component of a micro mechanical structure such as a membrane of a sound transducer may be clamped, i.e., fixed at a fixed (clamped) portion and cantilevered or, i.e., vibratable or deflectable, at a deflectable portion. The membrane may thus be denoted as a cantilevered structure.

The deflectable component may be stressed mechanically during deflection. Mechanical stress may arise, for example due to material strains. For example, material stress of a cantilever beam may be maximal at an end of the cantilever beam adjacent to the clamped portion thereof. Further, mechanical stress may arise, for example, at portions of the deflectable component that abuts other components or a substrate. Such abutting portions may be located at regions or portions of the deflectable component that show high amplitudes deformation such as a deflectable end of the cantilevered beam, at regions where a distance to other components is small and/or at regions where the clamping portions ends.

Also other parameters of the deflectable components may be required to be adapted. For example, silicon comprises a conductivity for electrical currents. The conductivity may be required to be increased (less electrical resistance) or decreased (higher electrical resistance) sectionally or in total, i.e., at the complete structure.

Parameters of silicon material may be adapted by applying other materials that form a compound with the silicon material. For example, silicon material may be doped to adapt generation of holes and/or electrons.

Micromechanical systems (MMS) in general may be used as actuators to deflect components thereof, for example to actuate other components. Other MMS systems may be used as a sensor and be configured to sense a mechanical deflection of parts thereof. Thus, MMS-sensors and/or actuators may comprise silicon components such as membranes that are very fragile and can easily be destroyed during handling and by mechanical shock in operation.

A hardness and/or a stiffness of the silicon material may be increased by adding further materials such as carbon (C), nitrogen (N) and/or oxygen (O) and/or metal materials such as a tantalum (Ta) material, a molybdenum (Mo) material, a titanium (Ti) material and/or one or more tertiary compounds thereof. For example, a tertiary compounds may be a tantalum nitride (TaN) material, a molybdenum disilicide ($MoSi_2$), a Tantalum disilicide ($TaSi_2$) or a titanium disilicide ($TiSi_2$).

The materials may be added, for example during at least one deposition process such as an epitaxial growth process, a reactive physical vapor deposition (PVD), a chemical vapor deposition (CVD) process, a variation thereof or the like. For example, a deposition gas may comprise the carbon material, the nitrogen material and/or the oxygen material and/or the metal materials such that the silicon material and the further material(s) form one or more compound materials. The compound material may be deposited, for example, at a base layer and/or at a substrate that may comprise silicon material and may be conductive. For example, a layer may be formed at the base layer and/or the substrate. The deposition may be repeated such that a plurality of layers with different materials may be formed.

The deposition may allow for a mechanically fixed connection between the base layer or substrate and the deposited layer(s). The silicon material and the carbon material may form a silicon carbide (SiC) material. The silicon material and the oxygen material may form a silicon oxide (SiO) material. The silicon material and the nitrogen material may form a silicon nitride (SiN) material. Based on process parameters a concentration value of one or more materials may vary such that in general the silicon carbide (SiC) material may obtained as $Si_xC_a$ material, such that the silicon oxide (SiO) material may be obtained as $Si_xO_b$ material, for example SiO and/or $SiO_2$, and/or such that the silicon nitride (SiN) material may be obtained as $Si_xN_c$ material. In addition, further materials may be obtained such as a silicon oxynitride ($Si_xO_bN_c$) material class comprising one or more $Si_xO_bN_c$ materials, a silicon carbon nitride ($Si_xC_aN_c$) material class comprising one or more $Si_xC_aN_c$ materials, a material class comprising one or more $Si_xC_aN_b$ materials comprising an oxygen doping ($Si_xC_aO_bN_c$) and/or a material class comprising one or more of the tantalum material, the molybdenum material, the titanium material and/or at least one of the tertiary compounds which may be summarized by the expression $Si_xTa_dMo_eTa_fTi_g$.

Within a material class x, a, b, c, d, e, f and/or g may comprise one or more equal or different values. A statistic distribution of x, a, b, c, d, e, f and/or g within each of the material classes may show, for example a Gaussian distribution with a center that may depend on process parameters such as a temperature, a pressure, an amount of Si material, and or the further materials. One or more different materials (C, O, N, Ta, Mo, Ta and/or Ti) may be deposited sequentially, one after the other or at the same time and in combination with or at the silicon material, for example, the Silicon material, the carbon material and the tantalum material at a first time and the silicon material and the oxygen material at a second time. When the materials are implanted sequentially, the materials may be deposited at partially or fully overlapping areas with respect to areas where material has been deposited previously. Alternatively the materials may be deposited at different areas. For example, a deposition of carbon and silicon may lead to a deposition of SiC which may increase a hardness of the structure material locally in a SiC area and with respect to a substrate such as silicon. A deposition of silicon and oxygen may allow for a deposition of SiO which may soften the structure locally, for example at the SiC area and with respect to the SiC material and/or increase the hardness with respect to the substrate, for example (poly-)silicon. A deposition of one or more of the metal materials may allow for an increased conductivity at regions of deposition such that the generation of an electric field, e.g., for generating a deflecting force, may be improved with respect to (poly-)silicon. Alternatively or in addition, circuit structures may be deposited by means of depositing the silicon material and the metal material. The circuit structures may be deposited for example, at an area where previously SiO has been deposited such that the circuit structures are insulated with respect to a conductive base layer by the SiO.

In the following, reference will be made to Si—C—O—N composites, which when taken literally stand for a compound comprising the silicon (Si) material, the carbon (C) material, the oxygen (O) material and the nitrogen (N) material. The expression Si—C—O—N shall not be limited to such a compound of materials and will be used for denoting a composite (compound) comprising silicon and at least the carbon material. The composite may further comprise optionally the oxygen material, the nitrogen material and/or one or more of the metal materials that may form compounds such as the above mentioned, e.g., $Si_xC_aO_bN_cTa_dMo_eTa_fTi_g$ with x and a comprising a value of at least 1 and b, c, d, e, f and g comprising any value equal to or greater than zero. The materials arranged may vary along a thickness direction along which the material (layers) is deposited (grown).

Effects of the mechanical stress, such as signs of fatigues (e.g., a fatigue break or a static deformation) of the deflectable component due to strains or hits/abutting may be reduced by arranging a stiffening structure comprising the Si—C—O—N material (stiffening material) at the deflectable portion at stressed regions such as strained portions or abutting portions. A hardness and/or a stiffening of the stiffening materials such as silicon carbide ($Si_xC_y$), silicon nitride ($Si_xN_y$) and/or silicon oxide ($Si_xO_y$) may be increased when compared to a stiffness or hardness of silicon (Si) materials. Thus, fabricated components such as silicon membranes or silicon beams of MMS may be improved with respect to reliability and loadability.

FIG. 1 shows a schematic side view of a micromechanical structure 10 comprising a substrate 12 and a functional structure 14 arranged at the substrate 12. The functional structure 14 comprises a functional region 16 configured to provide a mechanical active area and to deflect with respect to the substrate 12 responsive to a force 18 acting on the functional region 16. The functional structure 14 comprises a conductive base layer 22 and a stiffening structure 24. The stiffening structure 24 comprises a stiffening structure material arranged at the conductive base layer 22. The functional structure 24 only partially covers the conductive base layer 22 at the functional region 16. The stiffening structure material comprises a silicon material and at least a carbon material.

The stiffening structure may be, for example, a silicon carbide material. Silicon carbide may comprise a hardness that is higher than 3, 10 or 20 GPa, wherein the hardness may be measured, for example, according to Knoop and/or Vickers. The conducive base layer may comprise a silicon material. The silicon material may be a monocrystalline or a polycrystalline silicon material. The silicon material may comprise a hardness that is higher than 5, 10 or 12 GPa, wherein the hardness may depend, for example, on the structure of the crystalline structure of the material. The hardness of the silicon material and of the stiffening structure material, may be varied based on process parameters such as a temperature, a pressure and/or a depositing process. The depositing process for depositing (arranging) the conductive base layer at the substrate 12 and/or the stiffening material at the conductive base layer may be, for example, a reactive physical vapor deposition (PVD), a chemical vapor deposition (CVD) process or the like, such that the conductive base layer 22 is arranged to the substrate 12 by a rigid joint, wherein at the rigid joint (clamped region) of the conductive base layer 22 a deflection of the functional structure 14 is reduced or prevented when compared to a deflection of the functional structure 14 in the functional region 16.

The hardness may vary along the conductive base layer material, for example, based on an inhomogeneous crystalline structure. Alternatively or in addition the hardness of the stiffening structure material may vary along the stiffening structure material, e.g. due to a variation of a concentration of the carbon material and/or other materials of the Si—C—O—N compound.

To stiffen the conductive base layer with respect by means of the stiffening material, the stiffening material may comprise a hardness that is at least 1.5, 2 or 2.5 than the hardness of the conductive base layer material.

As described above, the stiffening structure material may further comprise at the least one of the nitrogen material, the oxygen material, the titanium material, the molybdenum material and/or the titanium material, wherein each of the materials comprises a material concentration within the stiffening structure material. The carbon concentration of the carbon material may be at least 1% and at most 100%, at least 3% and at most 80% or at least 10% at most 500% of the concentration of the silicon material of the stiffening structure. A concentration of the carbon material being equal to the concentration of the silicon material may allow for a so called diamond-like carbon.

A nitrogen material may combine with other materials in the Si—C—O—N compound for exemplary forming silicon nitride which may allow for a further increasing of the hardness. Silicon nitride (SiN) may comprise a Young's modulus with a value, that is greater than 100 GPa, greater than 150 GPa or greater than 200 GPa. The silicon material may form, for example, silicon oxide ($SiO/SiO_2$) which may allow for a reduced (electrical) conductivity when compared to silicon material. SiO may comprise a Young's modulus with a value, that is greater than 40 GPa, greater than 70 GPa or greater than 90 GPa. $SiO/SiO_2$ may comprise a hardness with a value, that is greater than 14 GPa, greater than 16 GPa or greater than 17 GPa. The stiffening structure 24 may thus comprise insulating properties. Alternatively, if the stiffening structure 24 may comprise conductive properties, e.g., if the Si—C—O—N compound comprises the titanium material and/or the tantalum material. All of the material combinations may allow for an adaption of behavior of the functional structure 14 with respect to temperature (such as expansion, deflection or pressure robustness, i.e. depending on requirements for a system comprising the micro mechanical structure 10, properties of the micro mechanical structure 10 may be adapted.

Thus, the stiffening structure 24 may stiffen the conductive base layer 22 at least at regions covered by the stiffening structure 24. The stiffening may lead to a changed, i.e. adapted, bending line (deflection curve) of the functional structure 14, of the functional region 16 respectively. For example, the stiffening structure 24 may be arranged at or adjacent to regions of the functional region 16 showing high or maximum strains during deflection such as fixing portions configured to clamp (fix) the functional structure 14 with respect to the substrate 12.

Alternatively, the stiffening structure 24 may be arranged at regions of the conductive base layer 22 comprising less or even a minimum of strain when the functional structure 14 is deflected. Such a portion may be, for example, a center of a membrane of a loudspeaker or a microphone when the membrane is clamped, fixed or mounted at edge portions.

The conductive base 22 layer may comprise silicon material and may be conductive with respect to an electrical current. Alternatively, the conductive base layer 22 may comprise a high electrical resistance. The conductive base layer 22 may be conductive with respect to a thermal energy such as heat.

The functional structure may be, for example, a membrane of an acoustic transducer. The acoustic transducer may be a microphone or a loudspeaker such that the functional structure 14 may be a membrane of a microphone or of a loudspeaker. The force 18 may be generated, for example, by an electrostatic or electrodynamic field that may attract or repeal the functional structure 14 with respect to the substrate 12. Alternatively or in addition, the force 18 may be for example inducted by an ambient pressure or a variation thereof deflecting the functional structure 14, the deflection being measurable for generating a microphone signal.

The stiffening structure 24 may be arranged at regions of the functional region 16 that may be configured to engage or abut with other components such as the substrate 12 and such that the stiffening structure 24 is configured to engage the other component (instead of the conductive base layer). This may allow for an increased durability of the functional structure 14. For example, a membrane of a digital loudspeaker may be configured to abut a substrate or a back plate electrode at deflected portions of the membrane. By arranging the stiffening structure 24 at regions that are configured to abut at the substrate 12 or the back plate electrode, the durability of the membrane may be increased based on the increased hardness of the functional region 16.

Alternatively, the stiffening structure 24 may be arranged at regions of the conductive base layer 22 that are configured to exhibit high strains when the functional regions 16 deflects, such as regions of the functional structure 16 adjacent to fixing points.

The concentration of the carbon material or other materials of the Si—C—O—N compound and thus the stiffening structure material may vary along a thickness direction 26 of the stiffening structure. The thickness direction may be a (shortest) direction that is arranged perpendicular to lateral directions along which the functional structure expands the most. The thickness direction 26 may be arranged parallel to a surface normal of the functional structure 14 and/or with respect to a surface at which the force 18 is acting. The surface normal may be parallel to the thickness direction 26 when the functional structure 14 comprises a rest position. In the rest position, the functional structure 14 may be undeflected.

A varying concentration of the carbon material and/or other materials along the thickness direction 26 enables varying parameters of the stiffening structure along with the thickness direction 26. For example, along the thickness direction 26, the hardness of the stiffening structure material may increase or decrease to compensate a varying mechanical load inducted by strains along the thickness direction 26.

An advantage of only partially covering the conductive base layer 22 is, for example, that properties, such as bending or a hardness of the surface of the functional structure may be adapted locally.

The concentration of one or more materials of the Si—C—O—N compound may vary step-wise along the thickness direction 26 of the stiffening structure 24. For example, the material concentration may vary in steps of more than 0.05%, more than 0.1% or more than 0.2% of the material concentration along the thickness direction 26. The variation may comprise an increase and/or a decrease of the material concentration of at least one of the materials. Thus, along the thickness direction 26 the concentration of at least one of the materials may first decrease or increase and afterwards increase or decrease. Alternatively or in addition, one or more of the materials of the functional structure may be arranged only partially along the thickness direction 26. For example, along the thickness direction 26, the stiffening structure 24 may comprise the silicon material and the carbon material at a side facing the conductive base layer 22. At an opposing surface layer or a top coat of the stiffening structure 24 the stiffening structure material may comprise the titanium material, e.g. to increase conductivity of the stiffening structure material at the surface layer. An increased conductivity may allow for modifying or adapting an electrostatic or electrodynamic field that may be generated between the functional structure 14, the conductive base layer 22 and/or the substrate 12.

In other words, decisive mechanical material parameters of layers, such as, for example, the hardness and the modules of elasticity (Young's Modulus) may be optimized by introducing carbon (C) into silicon (Si). The mechanical stressability (pressure, temperature, . . . ) thereof may improve considerably when using this composite as a part of a free-standing layer. There are several ways of applying Si—C compounds as a material. By additionally and specifically adding oxygen (O), nitrogen (N) and/or any combinations of these materials, obtained composites may allow for additional degrees of freedom when configuring the mechanical characteristics such as layer stress, Young's Modulus and the like.

Electromechanical characteristics of the functional structure may be improved over a very wide range by introducing other materials, such as, for example, tantalum, molybdenum, titanium and/or tertiary compounds or the like and/or by coating the functional structure for example, a poly-Si membrane, by the material systems mentioned.

With reference to the functional structure 14, an increase in mechanical stressability may exemplarily be achieved by partially coating a conductive base layer (such as, for example, doped polysilicon) by the layer system respectively the multilayer membrane (functional structure 14) mentioned one side or both sides.

FIG. 2 shows a schematic side view of a micromechanical structure 20, wherein two stiffening structures 24a and 24b are arranged at the conductive base layer 22 facing the substrate 12. The stiffening structures 24a and 24b are arranged at the functional region 16. The stiffening structures 24a and 24b are arranged at abutting portions 29a and 29b of the conductive base layer 22. The abutting portions 29a and 29b are configured to abut against the substrate 16, when the functional region 16 deflects. The stiffening structures 24a and 24b may be arranged such that the conductive base layer is prevented from abutting against the substrate 12 and such that the functional region 16 abuts against the substrate 12 at the stiffening structures 24a and 24b. Alternatively or in addition, further stiffening structures may be arranged at the conductive base layer 22, wherein the further stiffening structures may be arranged such that they do not abut against the substrate 12, when the functional region 16 is deflected.

The functional structure 24a is arranged such that it abuts the substrate 12 adjacent to a clamped region 28 at a cantilevered portion of the conductive base layer 22. The cantilevered portion may be, for example, a portion of the functional structure 14 or the conductive base layer 22 that is not clamped.

At transitions between the clamped region 28 and the deflectable functional region 16 forces resulting from the deflection may be increased due to high strains in the conductive base layer such that a predetermined breaking point may result in the conductive base layer 22. By arranging the stiffening structure 24a at or adjacent to the predetermined breaking point, instead of the conductive base layer the stiffening structure 24a may abut the substrate 12. Thus, the durability of the functional structure 14 may be increased.

The stiffening structure 24b is arranged at the functional region 16 where the functional region 16 would be configured to abut the substrate 12 when being deflected. Thus, instead of the conductive base layer 22, the functional structure 24b abuts the substrate 12 such that a mechanical load inducted into the conductive base layer 22 resulting from abutting may be reduced. The stiffening structure 24b is arranged at a portion of the conductive base layer 22 that may exhibit a high deflection and low strains when the functional region 16 deflects.

FIG. 3 shows a schematic side view of a micromechanical structure 30 comprising the substrate 12 and the stiffening structure 24. The functional structure 14 is deflectable responsive to the force 18 at the functional region. The stiffening structure 24 comprises two film structures 32a and 32b, wherein the film structure 32b is arranged at the conductive base layer 22 and the film structure 32a arranged at the film structure 32b at a side opposing a side facing the conductive base layer 22.

Each of the film structures 32a and 32b comprises a stiffening structure material, i.e., a Si—C—O—N compound that may different from each other. Alternatively, one of the film structure may be formed without the carbon material. Alternatively or in addition, the stiffening structure 24 may comprise more than two film structures, wherein at least one of the film structures comprises the carbon material. One or more film structures may comprise different materials that are different from the Si—C—O—N compound, such as an aluminum material or any other material.

The stiffening structure 24 comprising the film structures 32a and 32b, the film structures 32a and 32b comprising not only different concentrations but different materials may allow for a realization of a stiffening structure that is further functional responsive to other physical effects. For example, the film structures 32a and 32b may comprise a different thermal expansion coefficient and/or different conductivity parameters such that a deflection of the conductive base layer 22 responsive to a thermal gradient may be adapted or reduced. For example, the film structure 32b being formed insulating may allow for an insulating layer between the conductive base layer 22 and the (conductive) film structure 32a. A conductive film structure may be a contact surface of an electronic component or system, such as a source- and or a drain-contact of a transistor.

FIGS. 4a-d exemplarily show each a schematic side view of the functional region 16.

With respect to FIG. 4a the conductive base layer 22 comprising a thickness h1 is partially covered by a first stiffening structure 24a and a second stiffening structure 24b, both comprising a thickness h2, wherein the thicknesses h1 and h2 refer to an extent of the conductive base layer 22, the stiffness structure 24a and/or 24b respectively, along the thickness direction 26. The functional structure 16 comprises a total thickness $h_{total}$ wherein the total thickness $h_{total}$ may be formed as a sum of h1 and h2.

The stiffening structures 24a and 24b are arranged at a first side of the conductive base layer 22, e.g. a bottom side, wherein the bottom side may be a side of the conductive base layer 22 facing the substrate.

The stiffening structures 24a and 24b may comprise each a thickness that is different from each other. In this case, the total thickness $h_{total}$ may be a sum of the thickness h1 and the maximum thickness of the stiffening structures 24a and 24b. A share of the thicknesses h1 and h2 in the total thickness $h_{total}$ may each be more than 0% and less than 100%. Normalized to the total thickness $h_{total}$, the thicknesses h1 and h2 may be larger than 0 and smaller than 1.

With respect to FIG. 4b, the stiffening structures 24a and 24b are arranged at a second side of the conductive base layer 22, e.g. a top side opposing the first side. The top side and the bottom side may refer to an arrangement of the conductive base layer with respect to the not shown substrate. For example, the bottom side may be arranged facing the substrate. Alternatively, the top side may be arranged facing the substrate. The stiffening structures 24a and 24b are separated by a recess 34.

With respect to FIG. 4c, the functional region 16 comprises two conductive base layers 22a and 22b and the stiffening structure 24 that is sandwiched between the conductive base layers 22a and 22b.

The stiffening structure 24 covers partially the conductive base layers 22a and 22b such that a recess 34 is formed between the conductive base layers 22a and 22b at a region where the stiffening structure 24 does not cover the conductive base layers 22a and 22b. The conductive base layer 22a comprises the thickness h1. The conductive base layer 22b comprises a thickness h3 that may be equal or different from the thickness h1. The stiffening structure 24 comprises the thickness h2. The thicknesses h1, h2 and h3 may be summed up to the total thickness $h_{total}$. Normalized to the total thickness $h_{total}$, the thickness h1 may be larger than or equal to 0 and smaller than 1. The thickness h3 may be larger than or equal to 0 and smaller than 1. The thickness h2 may be larger than 0 and smaller than 1. A value of a sum of the thicknesses h1 and h3, normalized to the total thickness $h_{total}$, may be larger than 0 and smaller than 1. This means that at least one of the conductive base layers 22a and 22b is arranged at the functional structure 16 with a thickness larger than zero, wherein the other conductive base layer 22b or 22a is optional. If the thickness h1 comprises a value that is equal to 0, i.e. the conductive base layer 22a is missing, the thickness h3 may comprise a value that is larger than 0. If the thickness h3 comprises a value that is equal to 0, the thickness h1 may comprise a value that is larger than 0. Both cases may form a functional structure as depicted in FIG. 4a or FIG. 4b. Additionally, further recesses 34 may be arranged along the functional structure 24, as it is depicted for FIGS. 4a and 4b.

With respect to FIG. 4d, the conductive base layer 22 comprising the thickness h1 is partially covered at the second side by the stiffening structure 24a comprising the thickness h2. At the first side the conductive base layer 22 is partially covered by the stiffening structure 24b and a stiffening structure 24c, both comprising a thickness h4. The stiffening structures 24b and 24c are described as both having the same thickness, wherein alternatively the stiffening structure 24b may have a different thickness than the stiffening structure 24c and/or the stiffening structure 24a. The thicknesses h1, h2 and h4 may be summed up to the total thickness $h_{total}$. Normalized to the total thickness $h_{total}$, the thickness h1 may comprise a value that is larger than 0 and smaller than 1. The thicknesses h2 and h4 may both comprise a value that is larger than or equal to 0 and smaller than 1, wherein at least one of the thicknesses h2 or h4 comprises a value that is larger than 0. Thus, a value of a sum of the thicknesses h1 and h4, normalized to the total thickness $h_{total}$, is larger than 0 and smaller than 1.

The higher hardness of the stiffening structures 24a-c compared to the hardness of the conductive base layer may allow for a reduced total thickness of the functional structure 16 and/or a higher durability of the functional structure 16 when compared to known structures. The total thickness $h_{total}$ may be reduced and/or the durability may be increased. In addition, other advantageous effects may be achieved. The functional structure comprising the silicon material and at least the carbon material may exhibit a reduced affinity to wetting compared to pure silicon. This may allow for a reduced device sticking that may occur when the functional structure engages with the substrate. Also, sticking effects may be reduced that may occur during etching processes. Thus, one advantage is the marked increase in the mechanical stressability at reduced membrane thickness. Alternatively or in addition the increased hardness allows for an increased abrasive resistance, an increased breaking strength and/or an increased electrical capacity of conductive structures.

The increased robustness results in, on the one hand, an increase in stressability—with a constant membrane thickness—and on the other hand, a reduction in the thickness and thus the vibrating mass in the device, which may result in an improvement in response behavior, and additionally in an increase in a signal to noise ratio—SNR, for example, when the functional structure is formed as a membrane of a loudspeaker or a microphone. The functional structure and the respective micromechanical structure may be part of a sound transducer structure. The sound transducer structure may be configured to operate as a microphone and/or as a loudspeaker.

FIGS. 5a-i each show a schematic top or bottom view of a possible implementation of the functional region 16. The functional region 16 comprises exemplarily a base area with a round shape. In the functional region 16 at least one stiffening structure is arranged at the conductive base layer 22. The functional region 16, the conductive base layers 22, respectively, are depicted as having a round circular shape. A round shape may be advantageous when the functional region 16 is at least a part of a deflectable membrane. Alternatively, the functional region 16 and/or the conductive base layer 22 may comprise a different shape, for example an elliptical shape or a polygon shape. Alternatively, the functional region 16 and/or the conductive base layer 22 may be formed as a convex or concave formed curve.

With respect to FIG. 5a, the functional structure 24 covers the conductive base layer 22 with the exception of an edge portion 36 of the conductive base layer 22. For example, a surface of the conductive base layer 22 covered by the functional structure 24 may be covered more than 90%, more than 95% or more than 99%.

With respect to FIG. 5b, the functional structure 24 comprises a round shape and is arranged at a center of the conductive base layer 22 such that the stiffening structure 24 is arranged concentric with respect to the conductive base layer. A diameter of the stiffening structure may be, for example at least 1%, at least 20% or at least 50% of a diameter of the conductive base layer, wherein the diameter may also refer to a longest and/or shortest extension of the base area of the conductive base layer 22 when the same comprises a non-circular shape.

With respect to FIG. 5c, the functional structure 24 comprises a ring shape that is arranged concentric with respect to a base area the conductive base layer 22. Alternatively, a center of the functional 24 may be arranged at a different position of the conductive base layer 22, such that the stiffening structure 24 is not concentric with respect to the center of conductive base layer 22.

With respect to FIG. 5d, the conductive base layer 24 comprises a honeycomb structure comprising a plurality of honeycombs. The honeycomb structure totally covers the conductive base layer 22, wherein according to alternative embodiments it may cover the conductive base layer 22 only partially. An inner region of one, more or all of the honeycombs is formed as a recess 34 such that the conductive base layer 22 is uncovered by the stiffening structure material at the recesses 34. The recess 34 may have a polygon shape such as a hexagon shape.

A honeycomb formed stiffening structure 24 may lead to a high stiffness of the functional regions 16 as honeycomb structures may provide a high robustness against exerted forces.

With respect to FIG. 5e, the stiffening structure 24 comprises a star shape extending from the center to an outer circumference of the conductive base layer 22. For example, the functional region 16 may be clamped or mounted to the substrate at ends (beams or rays) of the star shape or at regions of the conductive base layer 22 that are between the ends of the star shape.

With respect to FIG. 5f, the conductive base layer 22 is partially covered by a plurality of stiffening structures 24a-e. Each of the stiffening structures 24a-e is formed as a ring structure comprising a diameter, a broadness of the respective ring and radius different from each other and arranged concentrically with respect to each other and to the center of the conductive base layer 22. Thus, the stiffening structures a-e form a multi-ring structure. Alternatively, one or more rings may comprise an equal broadness.

With respect to FIG. 5g, the stiffening structure is formed similar to the stiffening structure shown in FIG. 5d with the exception that the recesses 34 are formed as circles. This may lead to a varying extent of the material of the stiffening structure 24 along a first and/or second lateral direction (x1 and/or x2) arranged perpendicular to the thickness direction 26. At connection points 37 between two or more recesses 34 the extent along the first lateral direction x1 and/or the second lateral direction x2 may be higher, resulting in a higher amount of stiffening structure material at those points. This may lead to a higher stability of the stiffening structure 24.

With respect to FIG. 5h, the stiffening structure 24 comprises an inverse star shape when compared to the star shape depicted in FIG. 5e. The stiffening structure 24 partially covers the conductive base layer 22, sparing an inner star-shaped region.

Although the star shapes shown in FIGS. 5e and 5h are depicted as extending from the center of the conductive base layer 22 to the outer region, the star shapes may alternatively only extend to a value of less than 50%, less than 75% or less than 95% of the radius or extend along the first and/or second lateral direction x1, x2 of the conductive base layer 22.

With respect to FIG. 5i, the stiffening structures 24a-e are arranged at an inverse multi-ring shape at the conductive base layer 22 when compared to the stiffening structures 24a-e depicted in FIG. 5f. When compared to the functional structures 24a-d shown in FIG. 5f, the functional structures 24a-e shown in FIG. 5i may be arranged such that the outer region 36 and the center of the conductive base layer 22 are covered by the functional structures 24a-e, wherein in FIG. 5f, a comparable outer region 36 and the center are spared by the functional structures 24a-e.

FIGS. 6a-p show schematic top or bottom views of functional structures 14 comprising a quadratic conductive base layer 22 that is clamped at clamping regions 42a-d. The functional structure 14 may be, for example, a membrane of a sound transducing device, for example, a microphone or a loudspeaker. Although FIGS. 6a-p depict the conductive base layer being formed quadratic, the conductive base layer 22 may comprise other shapes, such as a round, an elliptical, a polygon shape or a combination thereof.

With respect to FIG. 6a, the stiffening structure 24 comprises a shape that may be obtained by an overlay of two elliptical structures being diagonally arranged between the clamping regions 42a and 42d, between the clamping regions 42b and 42c, respectively. In center portions where the two elliptical structures overlap, a circular structure may be arranged. Thus, the shape of the stiffening structure 24 may be obtained by overlapping two or more geometrical structures or shapes.

With respect to FIG. 6b a shape of the stiffening structure 24 may be obtained by overlapping two elliptical structures that are arranged diagonally at the conductive base layer 22 between two diagonally arranged clamping regions 42a-d, i.e., between the clamping regions 42a and 42d and between the clamping regions 42b and 42c.

With respect to FIG. 6c, the stiffening structure 24 comprises a shape that is geometrical similar to the shape of the conductive base layer 22, such that the stiffening structure 24 is formed quadratic with an edge length smaller than a corresponding edge length of the conductive base layer 22, wherein the edges of the conductive base layer and the edges of the stiffening structure 24 are essentially parallel to each other. The stiffening structure 24 is arranged at the center of the conductive base layer 22.

With respect to FIG. 6d, the stiffening structure 24 comprise a round shape, wherein a center of the stiffening structure 24 overlaps with a center of the conductive base layer 22.

With respect to FIG. 6e, the stiffening structure 24 comprises a shape that may be obtained by sparing shape regions of the conductive base layer 22 that may be formed by circles or one or more ellipses or parts of them, wherein for example a center of a circle or a special point of an ellipse is arranged outside the surface of the conductive base layer 22.

With respect to FIG. 6f, the stiffening structure 24 comprises a shape that may be obtained by overlapping two diagonally arranged ellipses, wherein the ellipses comprise an increased conjugate diameter when compared to the ellipses shown in FIG. 6b. The ellipses are projected only partially into the surface of the conductive base layer 22 such that the stiffening structure 24 comprises only parts of the ellipses.

With respect to FIG. 6g, the stiffening structure 24 comprises a shape that is geometrically similar to the shape of the conductive base layer 22, wherein the shape of the stiffening structure 24 is rotated when compared to FIG. 6c, e.g. it is rotated by an angle of 45°. Alternatively, the stiffening structure 24 may be rotated by any other angle, such as in a range between 0° and 360°, 0° and 180° or between 0° and 90°.

With respect to FIG. 6h, the stiffening structure 24 comprises a star shaped surface. The star shaped surface may be obtained, for example, by a circular shape and four elliptical shapes that are rotated by an angle, such as 45° to each other, wherein one elliptical shape may be arranged diagonally on the conductive base layer 22.

With respect to FIG. 6i the stiffening structure 24 shows an inverse shape when compared to the stiffening structure shown in FIG. 6a. Inversed means that regions of the conductive base layer 22 that are covered in a first shape by the stiffening structure are spared by the inversed stiffening structure and vice versa.

With respect to FIG. 6j, the stiffening structure 24 comprises a shape that is inversed to the shape of the stiffening structure shown in FIG. 6b.

With respect to FIG. 6k, the stiffening structure 24 comprises a shape that is inversed when compared to the shape of the stiffening structure depicted in FIG. 6c.

With respect to FIG. 6l, the stiffening structure 24 comprises a shape that is inversed to the shape of the stiffening structure depicted in FIG. 6d.

With respect to FIG. 6m the stiffening structure 24 comprises a shape that is inversed to the shape of the stiffening structure 24 depicted in FIG. 6e.

With respect to FIG. 6n, the stiffening structure 24 comprises a shape that is inversed to the shape of the stiffening structure 24 depicted in FIG. 6f.

With respect to FIG. 6o, the stiffening structure 24 comprises a shape that is inversed to the shape of the stiffening structure 24 depicted in FIG. 6g.

With respect to FIG. 6p, the stiffening structure 24 comprises a shape that is inversed to the shape of the stiffening structure 24 depicted in FIG. 6h.

A base area of the stiffening structure 24 may comprise at least a part of a circular shape, a star shape, a polygon shape, an elliptical shape, a honeycomb structure, any other shape and/or a combination thereof.

FIG. 7a shows in a top section a schematic side view of the stiffening structure 24 being arranged at the first side and in an inner region 38 of the conductive base layer 22. The outer region 36 is not or only partially covered by the stiffening structure 24. In a center section of FIG. 7a the stiffening structure 24 is arranged at the second side of the conductive base layer 22. In a bottom section of FIG. 6e the stiffening structure 24a is arranged at the first side of the conductive base layer 22 and the stiffening structure 24b is arranged at the second side of the conductive base layer 22.

Thus, the functional region 16 comprises the inner region 38 and two outer regions 36a and 36b, wherein the functional structure may be, for example, a beam structure that is clamped (fixed) at both ends to the substrate 12.

Figure 7B:
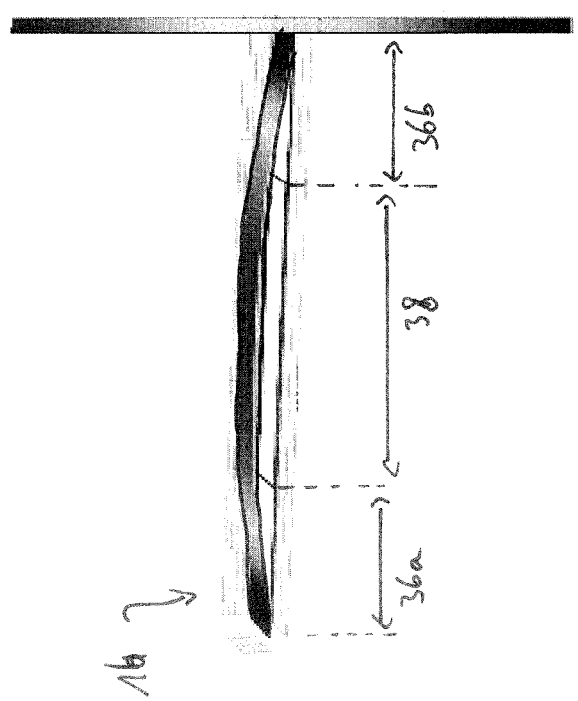
FIG. 7b shows a schematic perspective view of a simulation result simulating the bending curve that may be obtained by one of the functional regions of FIG. 7a according to a further embodiment.

FIG. 7b shows a schematic perspective view of a simulation result simulating the bending curve that may be obtained by one of the functional regions 16 of FIG. 7a, when the functional region 16 is deflected. Based on the stiffening structure 24 a bending curve of the functional region 16 is flattened along the inner region 38. Based on the flattened bending curve, the deflection of the functional region 16 may be more homogeneous along the inner region 38 when compared to a bending curve of a comparable bending beam that misses the stiffening structure. For example, when the functional region 16 is a membrane of a loudspeaker or a microphone, a homogenous deflection of the functional region 16 at the inner region 38 may lead to a more efficient sound transducing, i.e. sound generating or sound capturing. For example, a moved air volume of a loudspeaker membrane may be increased. As digital loudspeakers may operate by deflecting the membrane until it abuts a substrate or an electrode, the deflection may be performed more efficiently. In addition, the membrane may abut the substrate or the electrode at regions where the stiffening structure is arranged, such that damage of the membrane caused by abutting the substrate or the electrode may be reduced or prevented.

Figure 8A:
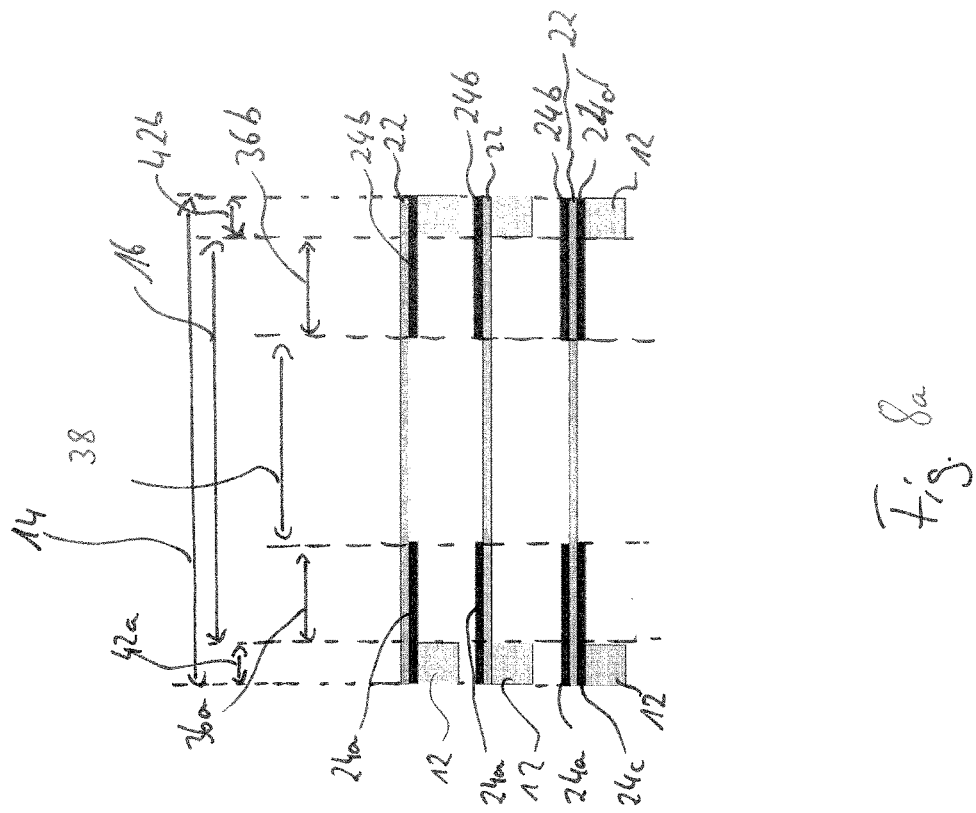
FIG. 8a shows in a top section a schematic side view of the stiffening structure being arranged in outer regions of the conductive base layer at the first side, in a center section a schematic side view of the stiffening structure being arranged at the second side and in a bottom section a schematic side view of the stiffening structure being arranged at the both sides according to a further embodiment.

FIG. 8a shows in a top section a schematic side view of the conductive base layer 22 being partially covered at the first side by the stiffening structures 24a and 24b. The stiffening structure 24a is arranged at the outer region 36a and at the clamped region 42a of the conductive base layer 22, wherein the clamped region 42a is arranged adjacent to the outer region 36a at a side opposing the inner region 38. Thus, the functional structure 14 is clamped at a first end at the clamped region 42a. The stiffening structure 24b is arranged at the outer region 36b and a clamped region 42b arranged adjacent to the outer region 36b at a side opposing the inner region 38.

FIG. 8a shows in a center section the functional structures 24a and 24b being arranged at the first side of the conductive base layer 22. At a bottom section of FIG. 8a, functional structures 24a-d are arranged at the first side and the second side of the conductive base layer 22 covering the conductive base layer at the outer regions 36a and 36b and the clamping regions 42a and 42b.

Figure 8B:
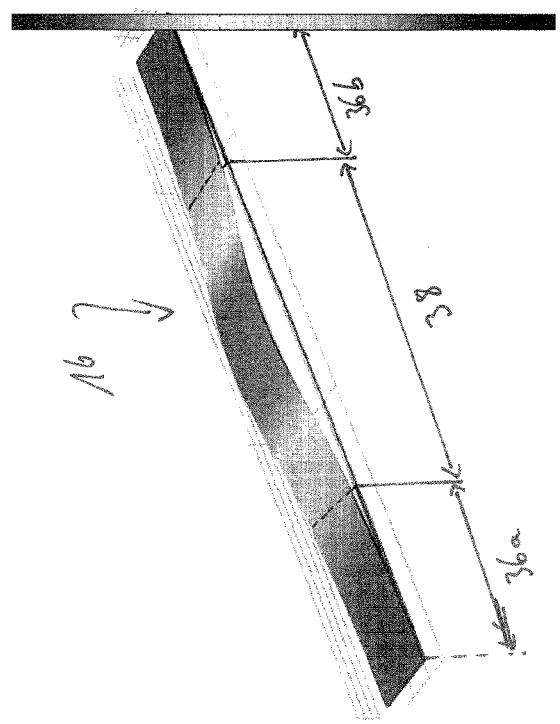
FIG. 8b shows a schematic perspective view of a simulation result simulating a deflection of the functional region of FIG. 8a according to a further embodiment.

FIG. 8b shows a schematic perspective view of a simulation result simulating a deflection of the functional region 16 of FIG. 8a. A bending curve of the functional region 16 is flattened at the outer regions 36 based on the stiffening structures 24a and 24b, 24a-d respectively. Thus, the stiffening structures 24a and 24b, 24a-d, respectively, may result in a reduced deflection of the functional regions at regions adjacent to the clamped regions.

This may result in reduced mechanical stress at boundary points where the substrate 12 ends to clamped the functional region. Thus, damages of the functional region 16, the functional structure 14, respectively, due to the mechanical stress may be reduced.

A length of the functional structure 16 may be, for example, more than 50 µm, more than 100 µm or more than 200 µm, wherein the length is formed by the inner region 38 and the outer regions 36a and 36b.

A total thickness of the functional structure may be, for example, in a range between 100 nm and 2 cm, 1 µm and 1 cm, or between 2 µm and 10 µm, or any other value. An amplitude of deflection of the cantilevered beam may comprise, for example, a value of the more than 10 µm, more than 50 µm or more than 100 µm.

Figure 9A:
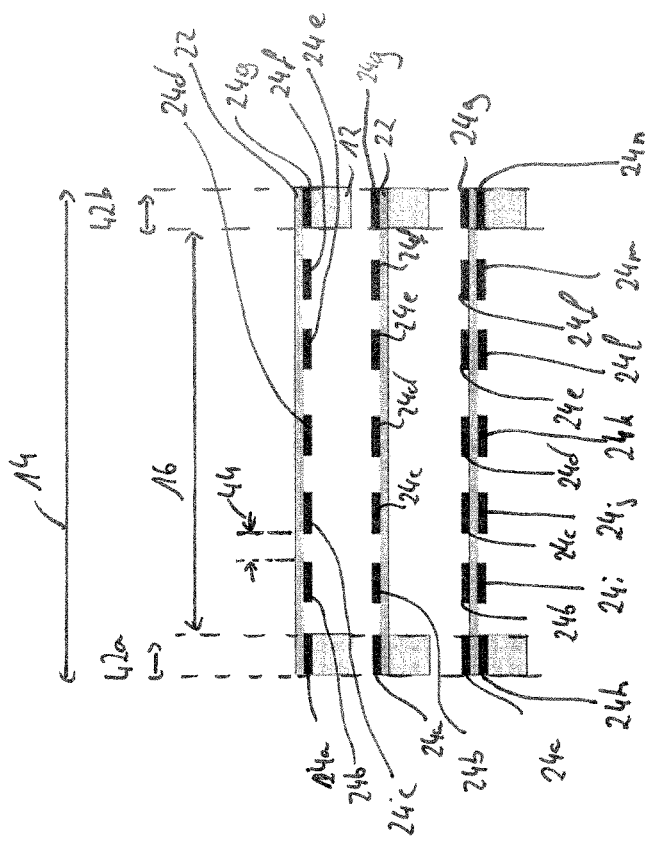
FIG. 9a shows in a top section a schematic side view of a plurality of stiffening structure being arranged spaced from each other at the conductive base layer at the first side, in a center section a schematic side view of the stiffening structure being arranged at the second side and in a bottom section a schematic side view of the stiffening structure being arranged at the both sides according to a further embodiment.

FIG. 9a shows in a top section a schematic side view of a conductive base layer 22 being covered partially at the first side by a plurality of stiffening structures 24a-e.

The stiffening structures 24a-g are spaced from each other by a distance 44, wherein the distance 44 may be equal or different from each other between each of the stiffening structures 24a-g.

In a center section the FIG. 9a shows a schematic side view of the conductive base layer where the stiffening structures 24a-g are arranged at the second side of the conductive base layer 22.

In a bottom section FIG. 9a shows a schematic side view of the conductive base layer being covered partially at the first side and the second side by a plurality of stiffening structures 24a-n.

The conductive base layer 22 may be a bending beam structure. Alternatively, the conductive base layer 22 may comprise a shape that may be round or of a polygon shape. FIG. 9a may thus sow a cross-sectional view of the conductive base layer depicted ion FIG. 5i.

Figure 9B:
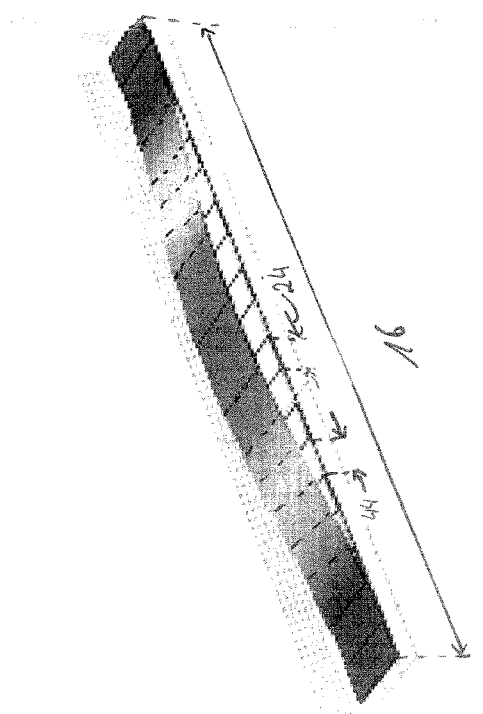
FIG. 9b shows a schematic perspective view of the functional region depicted in FIG. 9a, the functional region deflected responsive to the force acting on the functional region according to a further embodiment.

FIG. 9b shows a schematic perspective view of the functional region 16 depicted in FIG. 9a, the functional region 16 deflected responsive to the force acting on the functional region.

The functional region 16 deflects step-wise, i.e. among regions in which the stiffening structure 24 is arranged, a bending of the functional region 16 is reduced. At the spaces 44, bending is increased when compared to regions where the stiffening structure 24 is arranged.

A step-wise deflection may be advantageous when the functional region is used as a membrane in a digital loudspeaker with a membrane comprising multiple states of deflection. In case the digital loudspeaker comprises a plurality of deflection amplitudes of the membranes, those step-wise deflection statuses may be adjusted with a higher precision.

By modifying the bending curve of the membrane, of the function region, respectively, sound transducing characteristics of the micromechanical structure comprising the functional region may be set. By modifying the bending and/or the deflection curve resulting responsive to the force acting on the functional region, e.g. sound or an electrostatic or electrodynamic field, the respective microphone signal and/or the respective sound signal generated by the loudspeaker may be set and/or adjusted.

Figure 10B:
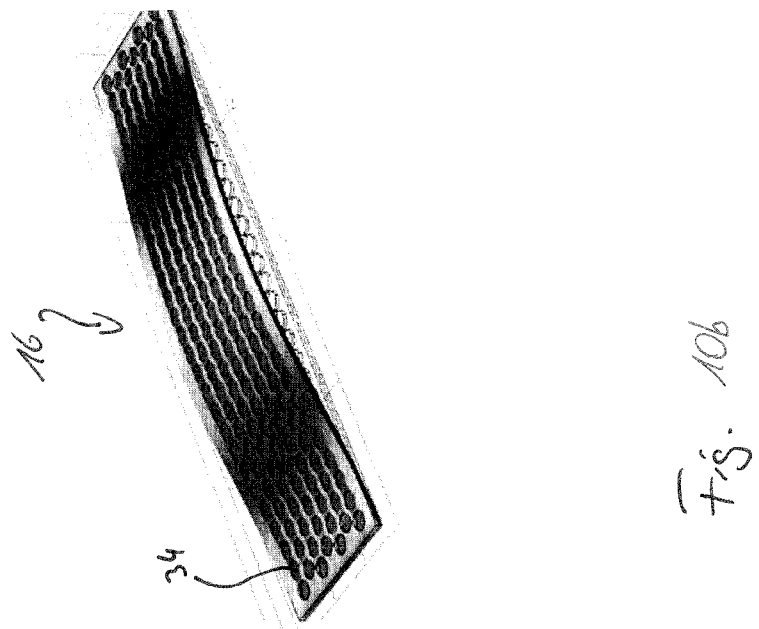
FIG. 10b shows a schematic perspective view of the functional region, wherein the recesses comprise a round shape according to a further embodiment.
Figure 10A:
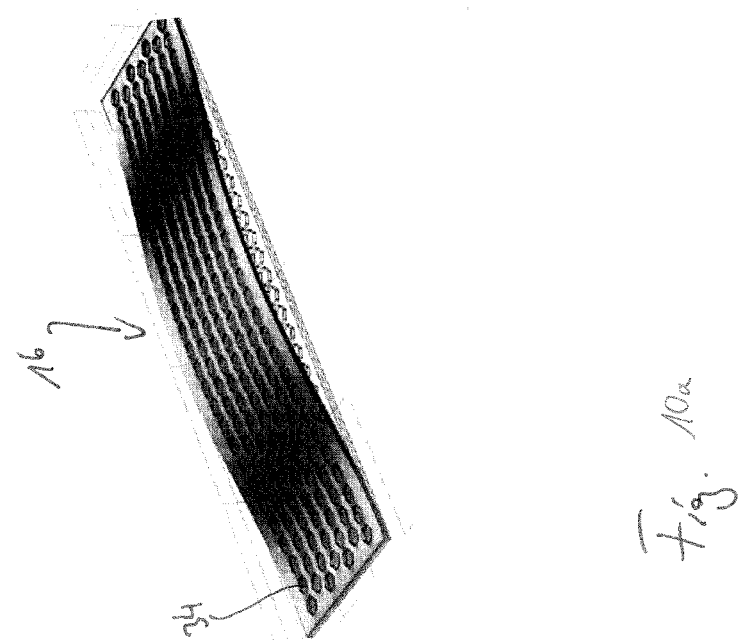
FIG. 10a shows a schematic perspective view of the functional region, wherein recesses are formed as hexagons according to a further embodiment.

FIG. 10a shows a schematic perspective view of the functional region 16, wherein the recesses 34 are formed as hexagons, such that the stiffening structure is formed as a honeycomb structure as it is depicted in FIG. 5d.

FIG. 10b shows a schematic perspective view of the functional region 16, wherein the recesses 34 comprise a round shape as it is depicted in FIG. 5g.

A locally arranged stiffening structure may allow for a locally insertion or induction of mechanical stress into the functional structure, for example, in a buckling structure such as a buckling plate of a loudspeaker. Alternatively or in addition, a local stiffening may be obtained.

FIG. 11 shows a schematic cross-sectional view of a micromechanical structure 110 comprising the substrate 12 and a functional structure 46 arranged at the substrate. The functional structure 46 comprises a functional region 48 which is deflectable with respect to the substrate 12 responsive to the force 18 acting on the functional region 48. The functional structure 46 comprises the conductive base layer 22 and a stiffening structure 52. The stiffening structure 52 comprises a stiffening structure material that partially covers the conductive base layer 22. Alternatively, the stiffening structure 52 may also cover the conductive base layer 22 completely, e.g. to obtain a robust functional structure that comprises a homogeneous bending curve.

The stiffening structure material comprises at least the carbon material. A concentration of the carbon material varies along the thickness direction 26 of the stiffening structure 52. The varying carbon concentration may result in a varying stiffness and/or a varying hardness of the stiffening structure material along the thickness direction. For example, the stiffening structure 52 may further comprise the silicon material and/or nitrogen material, the oxygen material, the titanium material, the molybdenum material, the tantalum material and/or a combination thereof such as tantalum nitride, i.e., the stiffening structure comprises the Si—C—O—N compound as it is described above.

The carbon concentration may vary step-wise or continuously. For example, a material of the stiffening structure 52 may comprise two or more different material concentration values along the thickness direction 26. Alternatively, along the thickness direction 26, the stiffening structure 52 may comprise a plurality of material concentration steps. For example, the plurality of material concentration steps may comprise more than 5, more than 10 or more than 20 steps.

Alternatively, the material concentration may vary continuously along the thickness direction 26, wherein in both cases, a step-wise or continuous variation the material concentration value may increase or decrease monotonically. Alternatively, the material concentration value may first, along the thickness direction 26, increase or decrease and afterwards decrease or increase.

In case of a deflection of the functional structure 46, a resulting mechanical stress may comprise a minimum strength at a neutral fiber of the functional structure 46, which may be a virtual line in the center of the thickness of the functional structure 46.

With an increased distance along the thickness direction 26 from the neutral fiber 54, mechanical stress may increase due to bending, stretching, compressing and/or deflection of the functional structure 46. A varying material concentration of the materials of the Si—C—O—N compound, may allow for compensate the rising mechanical stress.

A highest hardness of the stiffening structure 52 may be, for example, 3, 10 or 20 GPa. In addition, also a Young's Modulus may vary with the varying carbon concentration and/or the varying material concentration. The Young's Modulus may, for example, increase with an increased material concentration or the increased carbon concentration and comprise a value of more than 100 GPa, more than 200 GPa or more than 400 GPa. A Young's modulus of the conductive base layer may comprise a value of 60 GPa, more than 100 GPa or more than 150 GPa and. Thus, the Young's modulus of the stiffening structure layer may be, for example, higher than the Young's modulus by a factor of at least 1.5 (e.g., 90/60 GPa), at least 2 (e.g., 200/100 GPa) or 2.5 (e.g., 400/100 GPa).

The stiffening structure 52 may comprise a higher hardness than a hardness of the conductive base layer 22. A hardness of the conductive base layer may be, for example, around 5 GPa, around 8 GPa or around 10 GPa. The hardness of the stiffening structure may vary along the thickness direction, for example due to the varying material concentration and comprise values of e.g., 3, 10 or 20 GPa. The varying hardness may have a maximum and a minimum, wherein a highest hardness (maximum) may be higher than the hardness of the conductive base layer 22 by a factor of 1.5, a factor of 2 or a factor of 2.5, wherein an increased carbon concentration may lead to a high hardness FIGS. 12a-d show schematic side views of the functional structure 46 comprising at least one conductive base layer and at least one stiffening structure. The FIGS. 12a-d further show possible variations of a concentration of the silicon material of the functional structure 46. The conductive base layer may comprise silicon material, wherein the stiffening structure may comprise, for example, the carbon material, the oxygen material, the nitrogen material and/or further materials (thus the Si—C—O—N compound), as it is described in FIG. 11. The silicon concentration is normalized to a share of the stiffening structure material, exemplarily denoted as the carbon material C. A share of the silicon material normalized to a concentration of the carbon material is denoted as Si/C. A value of 1 for the silicon concentration Si/C refers to regions where silicon material is present and no or almost no stiffening structure material is present. A silicon concentration Si/C of 0 refers to regions, where only or almost exclusively stiffening structure material is present.

Although the plots shown in FIGS. 12*a-d* vary between 0 and 1, it is also possible that the plots vary between other values, such as 0.05 and 0.95, 0.1 and 0.9 or any other values. For example, the silicon material may be a doped silicon material comprising a doping material such as phosphor, boron or the like reducing the share of the silicon material although the share of the Si—C—O—N compound may remain unchanged.

FIG. 12*a* shows a schematic side view of the function structure 46 comprising a first conductive base layer 22*a* and a second conductive base layer 22*b* sandwiching the stiffening structure 52. Along the thickness direction 26, the second conductive base layer 22*b* is arranged and covered by the stiffening structure 52. The conductive base layer 22*a* covers the stiffening structure 52 at a surface opposing a surface that is facing the conductive base layer 22*b*. A thickness of the conductive base layer may comprise a value of less than 1 mm, less than 100 nm or less than 10 nm and thus comprise a value of close to 0.

FIG. 12*a* further shows a plot depicting different material concentration variations along the thickness direction 26 denoted as "1", "2" and "3". At the second conductive base layer 22*b*, a silicon concentration normalized to a value of the carbon concentration is 1, i.e. the conductive base layer 22*b* comprises the silicon material with a share of approximately 100%. Along the thickness direction 26, a share of the silicon material with respect to the carbon materiel, the Si—C—O—N compound respectively, is reduced up to a minimum value. The minimum value may be 0 or a value close to 0, such as 0.1, 0.15 or 0.2. Thus, the material concentration, i.e. the carbon concentration, is increased along the thickness direction. Further, along the thickness direction 26, the silicon concentration is increased and the material concentration is decreased such that the plots 1, 2 and 3 head into the direction of a silicon material concentration (Si/C) with a value of 1.

As it is depicted by the plots 1, 2 and 3, the concentration may vary linearly (plot 1) or non-linear (plots 2 and 3). The plots 1, 2 and 3 show a continuous variation of the material concentration along the thickness direction 26.

FIG. 12*b* shows a schematic side view of the functional structure 46 comprising the conductive base layer 22 being sandwiched by a first stiffening structure 52*a* and a second stiffening structure 52*b*. The conductive base layer 22 comprises a minimum carbon concentration, such that the material concentration Si/C comprises a maximum value at regions where the conductive base layer 22 is arranged, as it is indicated by the plots 1 and 2 depicting possible concentration variations. Plot 1 depicts a continuous variation of the material concentration and may correspond to the plot 2 of FIG. 12*a*. Plot 2 of FIG. 12*b* depicts a step-wise variation of the material concentration, wherein the silicon concentration comprises a maximum value at regions where the conductive base layer 22 is arranged.

In FIG. 12*c*, the stiffening structure 52 is covered at a first side of the stiffening structure 52 by the conductive base layer 22. At a second side of the stiffening structure 52 opposing the first side facing the conductive base layer 22, the silicon concentration comprises a value of 0 or close to 0. Along the inverse thickness direction, the silicon concentration increases, wherein the increasing may show different variation levels and linear and/or non-linear concentration variations as it is depicted for the plots 1, 2 and 3.

FIG. 12*d* shows a schematic side view where the second side of the conductive base layer 22 is covered by the stiffening structure 52. The stiffening structure 52 comprises a maximum carbon concentration at a side opposing the side facing the conductive base layer 22.

Although the FIGS. 12*a-d* show the functional structure 46 being formed by two layers (FIGS. 12*a*, 12*c* and 12*d*) or of three layers (FIG. 12*b*), alternatively the stiffening structure 46 may be formed integrally. For example, at the conductive base layer 22, the stiffening structure material may be arranged with a varying concentration of the stiffening structure material. Although the FIGS. 12*a-d* show the stiffening structure 52 completely covering the conductive base layer 22 or the conductive base layers 22*a* and 22*b*, alternatively the stiffening structure 52 may only partially cover the conductive base layers(s) 22, 22*a* and 22*b*, respectively.

In other words, the FIGS. 12*a-d* show a rough overview over potential layer setups and layer compositions, wherein this concept is combinable with the concept of the functional structure. Depending on the type of deposition and of the type of layer setup, varying influences may be achieved with respect to the physical characteristics, such as an influence on the bending curve, the mechanical stress due to abutting or the like.

FIG. 13 shows a schematic cross-sectional view of a micromechanical structure 130 comprising the functional structure 46 and a back plate electrode 54. With respect to FIG. 11, the back plate electrode 54 may be part of the substrate 12. The substrate 12 comprises a base layer 56. The base layer 56 may be, for example, formed by a silicon wafer. At the base layer 56, a multilayer structure 58 is arranged. The multilayer structure 58 may comprise, for example, a Tetraethyl orthosilicate (TEOS) layer or stack. The micromechanical structure 130 comprises contacts 62*a-c* that may comprise a gold material, a copper material or any other conductive material.

The contacts 62*a-c* are formed as vias and configured to interfuse the base layer 56 (contact 62*a*), the functional structure 46 (contact 62*b*), the back plate 54 (contact 62*c*), respectively. The back plate 54 may be formed, for example, by a polysilicon material. Thus, an electrical voltage may be applied to the functional structure 46, the back plate 54 and/or the base layer 56.

By applying a voltage between the contacts 62*b* and 62*c*, an attraction force 18*a* may be generated between the back plate 54 and the functional structure 46, when the functional structure 46 and the back plate 54 are charged with a charge of different polarity. When the functional structure 46 and the back plate 54 are charged with a charge of equal polarity, a repelling force 18*b* may be generated between the back plate 54 and the functional structure 46.

The functional structure 46 may be configured to abut the back plate 54 at an abutting region 64 of the back plate 54. The functional structure 46 may be configured to abut the substrate 12 at abutting portions 66*a* and 66*b* of the substrate 12 where the substrate 12 starts and/or stops clamping the functional structure 46. Alternatively, the back plate 54 may be a part of the substrate 12, such that the functional structure 46 is configured to abut the substrate 12 at the abutting region 64.

The micromechanical structure 130 may be configured to operate as a sound transducer. The functional structure 46 may thus be a membrane structure configured to emit sound pressure levels and therefore sound when the micromechanical structure is part of a loudspeaker.

Alternatively, an external force, such as a sound pressure level, may induce the attraction force 18a and/or the repelling force 18b such that an electrical signal may be acquired at the contacts 62b and 62c. For example, the micromechanical structure 130 may be part of a microphone structure.

The stiffening structure comprised by the functional structure 46 may thus be configured set sound transducing characteristics of the micromechanical structure as a variation of the Young's Modulus and/or the hardness may be configured to adapt a bending curve of the functional structure 46 and thus may adapt the electrical signal being acquired at the contacts 62b and 62c or of the sound being emitted by a loudspeaker.

Alternatively or in addition, the micromechanical structure 130 may comprise one or more further functional structures 46 (gradient membrane) and/or 14 (multilayer membrane) or the functional structure 14. The functional structure 14 may be arranged, for example, instead of the functional 46. Alternatively or in addition, the functional structure 14 may be arranged at a side of the back plate 54 opposing the functional structure 46 such that two functional structures are arranged, sandwiching the back plate 54, wherein both functional structures are configured to deflect responsive to the force 18a and/or the force 18b acting on the respective functional structure.

An advantage of the functional structures 14 and/or 46 is that in contrast to known concepts a voltage, at which a membrane structure may be excited to vibrate may, as far as the process is concerned, may be controlled by means of the material concentration instead of only by the implantation dose and the temperature.

In other words, when introducing C/N/O and/or other materials, an additional degree of freedom may be achieved for manufacturing. For example, an operating voltage or a voltage of the microphone signal in a MEMS microphone may be adjusted, for example. One idea of the invention is applying a layer and/or a layer system containing Si—C—O—N onto microtechnologically manufactured structures in order to improve the electrical and mechanical characteristics thereof.

Basically, there may be two fundamental approaches for integrating the Si—C and/or further materials into the manufacturing process in situ, i.e. while depositing. Within the approaches, in turn, there are different types of arrangements, which are discussed above.

The layers and/or the layer systems described above may be manufactured, for example, by means of conventional processes of deposition such as reactive PVD, CVD, or the like.

With respect to the functional structure 46, another way of applying layers may be using a gradient membrane containing silicon, the carbon material, the oxygen material and/or the nitrogen material or a variety of layers as described above, which allows varying the material concentration content over the layer thickness step by step or continuously. This may allow for adjusting the characteristic of the layer even more specifically. A rough plot of this method of manufacturing is shown in FIG. 12. The principle of deposition and achievable advantages in a gradient membrane containing the silicon and the carbon, the oxygen and/or the nitrogen material may be similar to a multilayer membrane such as it is described for the functional structure 14.

A relative position of the functional structure 46 with respect to the back plate electrode 54 may be varied. Depending on whether the membrane is operated above, in the center of or below the counter electrode arranged at the back plate 54 for example, different characteristics are regards pressure stability may be achieved. Influencing the characteristics of the system of the deposition is granted a further degree of freedom when compared to existing material layers which, up to now, could only be controlled by implantation and the temperature budget. Both the functional structure 14 and the functional structure 46 allow to make use of the advantages of a Si—C material and/or a potential layer setup made up of a combination of thin films containing Si—C—O—N in MMS and/or MEMS elements and thus developing an advantage with respect to known concepts.

Using the layers and/or gradient membranes as they are described may allow for increasing the resistance and/or the stability of conductive detached structures, such as, for example, membranes or bending beams. Additionally, an improvement of anti-sticking characteristics (caused by the lower wettability of carbon) may be achieved, which may, among other things, result in different, novel and easier setups of the entire device. This may allow for sparing further protective layers such as silicon nitride (SNIT) or intermediate oxide layers.

In known poly-Si membranes, as are used for MEMS elements, in particular in D-sound devices, decisive trials of stability, such as drop and pressure tests, are usual. A known Si microphone may have a limit at a pressure difference of roughly 2 bar. An increased robustness may allow for, on the one hand, increasing the stressability—with a constant membrane thickness—and, on the other hand, reducing the membrane thickness, and thus the vibrating mass in the device, which may result in an improvement in response and additionally in an increase of the SNR. Known polysilicon layers may comprise a thickness of, for example, between 330 nm to 2 µm and may comprise special designs trying to improve stressability effects of membrane structures. By varying the stiffness and/or the hardness of a stiffening structure, the temperature characteristics of the additionally applied layers containing the Si—C—O—N materials may also be used for adjusting the voltage.

Further, a maximum pressure load, that is in known concepts at roughly 2 bar, may be increased.

Figure 14B:
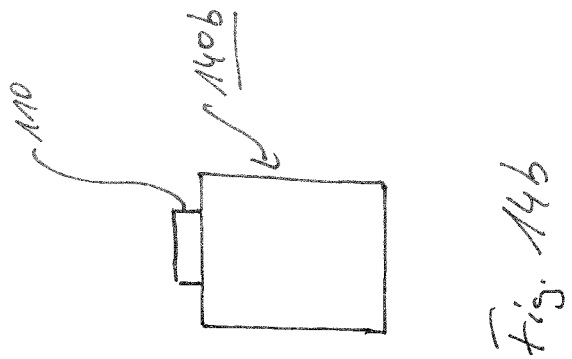
FIG. 14b shows a schematic block diagram of a micro mechanical sound transducer, comprising the micro mechanical structure described in FIG. 11 according to a further embodiment.
Figure 14A:
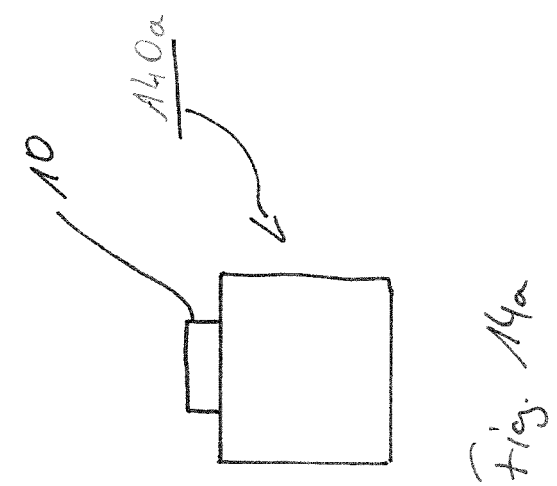
FIG. 14a shows a schematic block diagram of a micro mechanical sound transducer, comprising the micro mechanical structure described in FIG. 1 according to a further embodiment.

FIG. 14a shows a schematic block diagram of a micro mechanical sound transducer 140a, wherein the micro mechanical sound transducer 140a comprises the micro mechanical structure 10. The micro mechanical sound transducer 140a may be configured to sense variations in an ambient pressure, such as a sound pressure level. The variations in the sound pressure level may enable the functional region of the micro mechanical structure 10 to deflect. Thus, the functional region may be deflectable responsive to the sound pressure level. For example, an electrostatic field may be arranged between the functional region and the substrate or a back plate electrode arranged at the micro mechanical structure 10. A deflection of the functional region may lead to a varying charge and/or voltage sensible between the functional region and the substrate, the back plate electrode respectively.

Alternatively, the micro mechanical sound transducer 140a may be configured to apply a force at the functional region, for example, by applying an electrostatic or electrodynamic field such that the functional region deflects based on the electrostatic or electrodynamic field such that sound may be emitted by the micro mechanical sound transducer 140a. The micro mechanical sound transducer 140a may thus be configured to operate as a microphone or as a loudspeaker.

Alternatively or in addition, the micro mechanical sound transducer may comprise a micro mechanical structure 20, 30 or 130.

FIG. 14b shows a schematic block diagram of a micro mechanical sound transducer 140b, wherein the micro mechanical sound transducer 140b comprises the micro mechanical structure 110 instead of the micro mechanical structure 10. The micro mechanical structure 110 may configured as it is described for the micro mechanical structure 10 in FIG. 14a such that the micro mechanical sound transducer 140b may be configured to operate as a microphone or as a loudspeaker.

Alternatively, the micro mechanical sound transducer 110 may comprise the micro mechanical structure 10 in addition to the micro mechanical structure 110.

Figure 15:
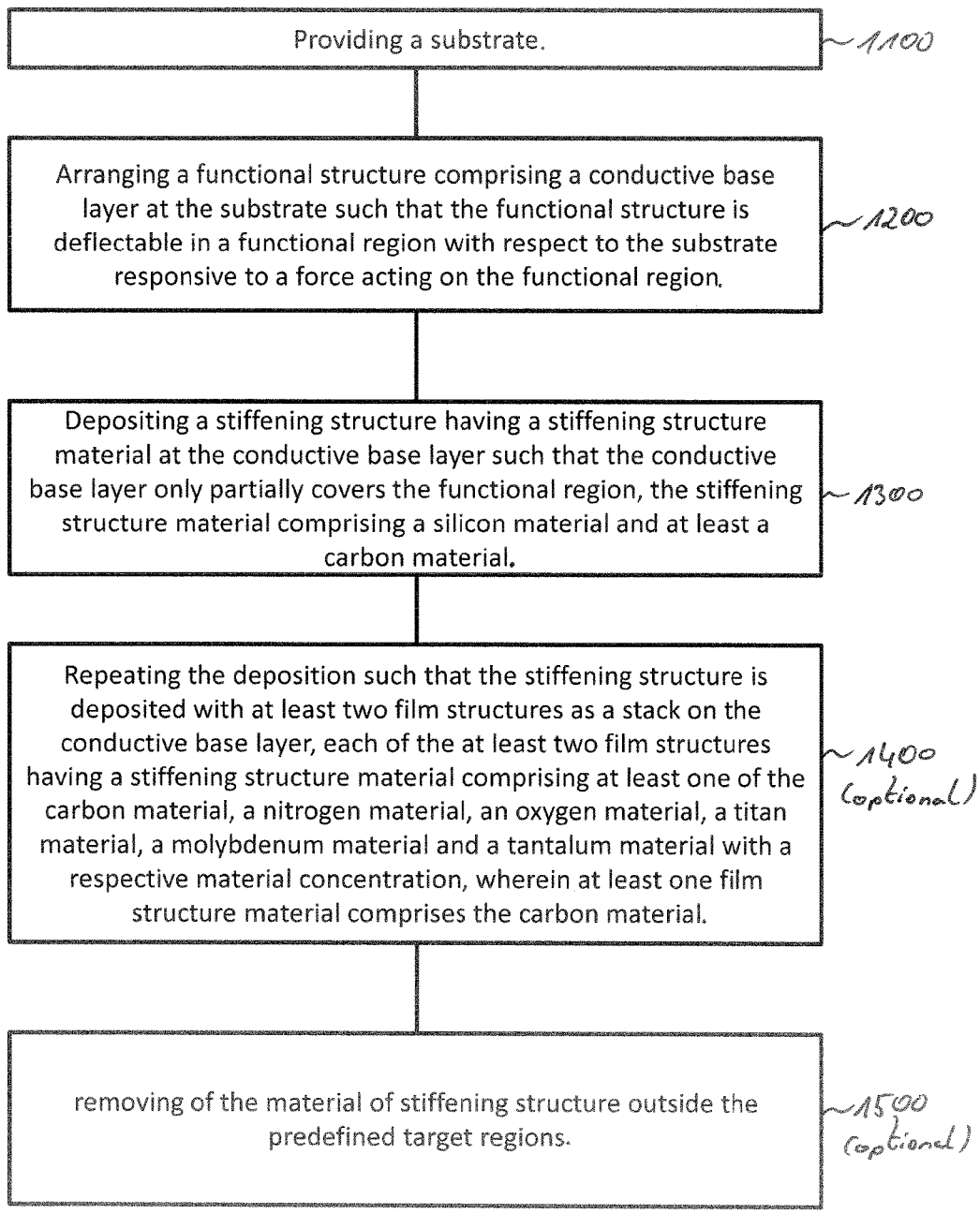
FIG. 15 shows a schematic flow chart of a method for fabricating a micromechanical structure comprising a multilayer membrane according to an embodiment.

FIG. 15 shows a schematic flow chart of a method 1000 for fabricating a micromechanical structure. The method 1000 comprises a step 1100 in which a substrate is provided. The method 1000 further comprises a step 1200. The step 1200 comprises arranging a functional structure comprising a conductive base layer at the substrate such that the functional structure is deflectable in a functional region with respect to the substrate responsive to a force acting on the functional region. The method 1000 comprises a step 1300. In the step 1300, a stiffening structure having a stiffening structure material is deposited at the conductive base layer such that the conductive base layer only partially covers the functional region, the stiffening structure material comprises a silicon material and at least a carbon material.

In an optional step 1400 of the method 1000, the deposition is repeated such that the stiffening structure is deposited with at least two film structures as a stack on the conductive base layer. Each of the at least two film structures comprises a stiffening structure material comprising at least one of the carbon material, the nitrogen material, the oxygen material, the titanium material, the molybdenum material and tantalum material with a respective material concentration. At least one of the film structures comprises the carbon material. The metal further comprises an optional step 1500. In the optional step 1500, material of the stiffening structure is removed outside the predefined target regions. The step 1500 may be executed, for example, if during the depositing, for example, during the step 1300, stiffening structure material is deposited outside the predefined target regions.

Method 1000 may be executed, for example, for manufacturing the micromechanical device 10, 20, 30 or the micromechanical structure 130, when the functional structure 14 is arranged and/or the functional structure 14.

Figure 16:
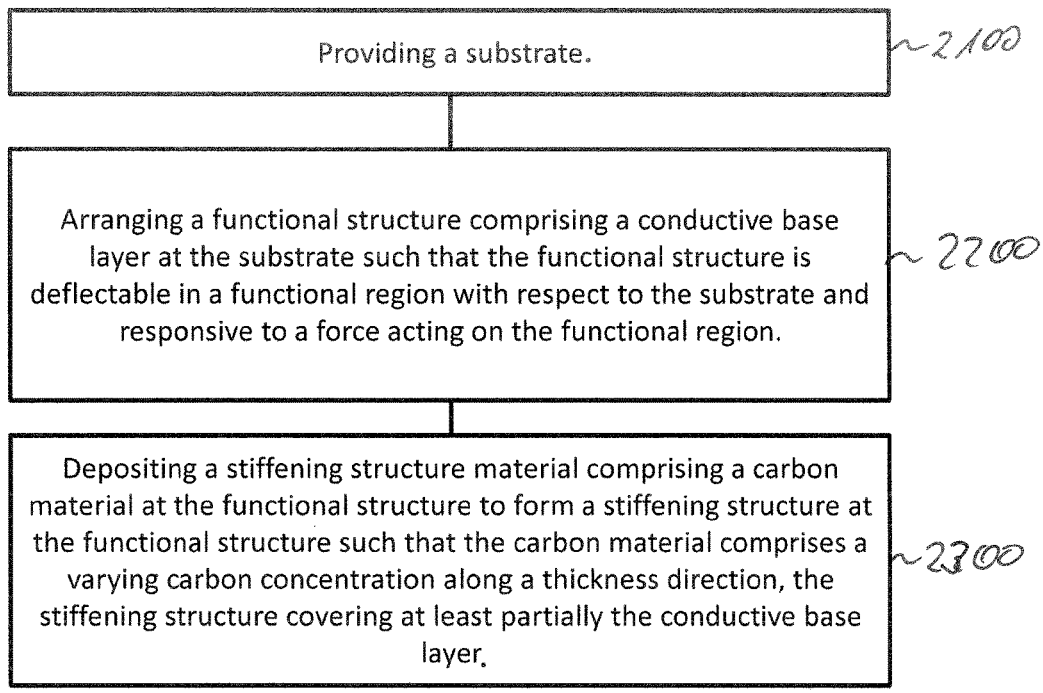
FIG. 16 shows a schematic flow chart of a method for fabricating a micromechanical structure comprising a gradient membrane according to a further embodiment.

FIG. 16 shows a schematic flow chart of a method 2000 for fabricating a micromechanical structure. The method 2000 comprises a step 2100. In the step 2100 a substrate is provided. The method 2100 comprise a step 2200. The step 2200 comprises arranging a functional structure comprising a conductive base layer at the substrate such that the functional structure is deflectable in a functional region with respect to the substrate and responsive to a force acting on the functional region.

The method 2000 further comprises a step 2300. The step 2300 comprises depositing a stiffening structure material comprising a carbon material at the functional structure to form a stiffening structure at the functional structure such that the carbon material comprises a very carbon concentration along a thickness direction. The stiffening structure is deposited such that the stiffening structure covers at least partially the conductive base layer.

Method 2000 may be executed, for example, for manufacturing the micromechanical structure 110, the micromechanical structure 130, when the functional structure 46 is arranged and/or the functional structure 46 itself.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A micro mechanical structure comprising:
a substrate; and
a functional structure arranged at the substrate;
wherein the functional structure comprises a functional region configured to repeatedly deflect with respect to the substrate responsive to a force acting on the functional region;
wherein the functional structure comprises a conductive base layer;
wherein the functional structure comprises a stiffening structure having a stiffening structure material arranged at the conductive base layer and only partially covering the conductive base layer at the functional region;
wherein the stiffening structure material comprises a silicon material and at least a carbon material; and
wherein a concentration of the carbon material varies along a thickness direction of the stiffening structure; and
wherein the concentration of the carbon material varies stepwise with a plurality of steps.

2. The micro mechanical structure according to claim 1, wherein the stiffening structure material comprises the carbon material with a concentration that is at least 1% of the concentration of the silicon material.

3. The micro mechanical structure according to claim 1, wherein the stiffening structure material additionally comprises at least one of a nitrogen material, an oxygen material, a titanium material, a molybdenum material and a tantalum material with a material concentration.

4. The micro mechanical structure according to claim 3, wherein the material concentration varies along a thickness direction of the stiffening structure.

5. The micro mechanical structure according to claim 4, wherein the material concentration varies stepwise along the thickness direction of the stiffening structure.

6. The micro mechanical structure according to claim 3, wherein the stiffening structure comprises at least two film structures forming a stack on the conductive base layer, each of the at least two film structures having a stiffening structure material comprising at least one of the carbon material, the nitrogen material, the oxygen material, the titanium material, the molybdenum material and the tantalum material with the respective material concentration, wherein at least one film structure material comprises the carbon material.

7. The micro mechanical structure according to claim 1, wherein the stiffening structure material comprises a hardness that is higher than a hardness of a material of the conductive base layer.

8. The micro mechanical structure according to claim 1, wherein a first stiffening structure is arranged at a first surface area of the conductive base layer and wherein a second stiffening structure is arranged at a second surface area of the conductive base layer, the second stiffening structure only partially covering the conductive base layer at the second surface area, the second surface area opposing the first surface area.

9. The micro mechanical structure according to claim 1, wherein a base area of the stiffening structure comprises at least a part of a circular shape, a ring shape, a star shape, a polygon shape, an elliptical shape, a honeycomb structured shape or a combination thereof.

10. The micro mechanical structure according to claim 1, comprising a plurality of stiffening structures arranged at the conductive base layer.

11. The micro mechanical structure according to claim 1, wherein the functional structure is a membrane structure and wherein the micro mechanical structure is part of a sound transducer structure.

12. The micro mechanical structure according to claim 1, wherein the stiffening structure is arranged at abutting portions of the functional structure and configured to abut against the substrate when the functional region deflects.

13. The micro mechanical structure according to claim 1, wherein the stiffening structure is configured to set sound transducing characteristics of the micro mechanical structure.

14. A micro mechanical sound transducer comprising the micro mechanical structure according to claim 1.

15. The micro mechanical sound transducer according to claim 14, wherein the micro mechanical sound transducer is a microphone.

16. The micro mechanical sound transducer according to claim 14, wherein the micro mechanical sound transducer is a loudspeaker.

17. A micro mechanical structure comprising:
a substrate; and
a functional structure arranged at the substrate;
wherein the functional structure comprises a functional region which is repeatedly deflectable with respect to the substrate responsive to a force acting on the functional region;
wherein the functional structure comprises a conductive base layer;
wherein the functional structure comprises a stiffening structure having a stiffening structure material covering at least partially the conductive base layer;
wherein the stiffening structure material comprises a carbon material comprising a varying carbon concentration along a thickness direction of the stiffening structure; and
wherein the carbon concentration varies stepwise with a plurality of steps.

18. A method for fabricating a micro mechanical structure, the method comprising:
providing a substrate;
arranging a functional structure comprising a conductive base layer at the substrate such that the functional structure is repeatedly deflectable in a functional region with respect to the substrate responsive to a force acting on the functional region;
depositing a stiffening structure having a stiffening structure material at the conductive base layer such that the stiffening structure only partially covers the functional region, the stiffening structure material comprising a silicon material and at least a carbon material;
wherein depositing the stiffening structure comprises applying a physical vapor deposition or a chemical vapor deposition process; and
wherein the deposition is repeated such that the stiffening structure is deposited with at least two film structures as a stack on the conductive base layer, each of the at least two film structures having a respective stiffening structure material comprising at least one of a carbon material, a nitrogen material, an oxygen material, a titanium material, a molybdenum material and a tantalum material with a respective material concentration, wherein at least one film structure material comprises the carbon material, and the respective material concentration varies stepwise with a plurality of steps.

19. The method as in claim 18, wherein, the deposition comprises deposition of a silicon material and at least one of a carbon material, a nitrogen material, an oxygen material, a titanium material, a molybdenum material and a tantalum material with a respective concentration at the conductive base layer.

20. The method as in claim 18, wherein the stiffening structure material is deposited in regions outside predefined target regions of the stiffening structure, the method further comprising:
removing of the material of the stiffening structure outside the predefined target regions.

21. A method for fabricating a micro mechanical structure comprising:
providing a substrate;
arranging a functional structure comprising a conductive base layer at the substrate such that the functional structure is repeatedly deflectable in a functional region with respect to the substrate and responsive to a force acting on the functional region; and
depositing a stiffening structure material comprising a carbon material at the functional structure to form a stiffening structure at the functional structure such that the carbon material comprises a varying carbon concentration along a thickness direction, the stiffening structure covering at least partially the conductive base layer, wherein the carbon concentration varies stepwise with a plurality of steps.

22. The method according to claim 21, wherein the stiffening structure material is deposited by a physical vapor deposition process or a chemical vapor deposition process.

23. The method according to claim 21, wherein during the deposition of the stiffening structure material the carbon material and at least one of a nitrogen material, an oxygen material, a titanium material, a molybdenum material and a tantalum material with a respective concentration is deposited, wherein the respective concentration varies along a thickness direction along which the functional region is deflectable.

24. The method according to claim 21, wherein the deposition comprises deposition of at least two film structures as a stack on the conductive base layer, each of the at least two film structures having a respective stiffening structure material comprising at least one of the carbon material, a nitrogen material, an oxygen material, a titanium material, a molybdenum material and a tantalum material with a respective concentration, wherein at least one film structure material comprises the carbon material and wherein the respective concentration varies between the at least two film structures.

25. A micro mechanical structure comprising:
a substrate; and
a functional structure arranged at the substrate;
wherein the functional structure comprises a functional region configured to deflect with respect to the substrate responsive to a force acting on the functional region;
wherein the functional structure comprises a conductive base layer;
wherein the functional structure comprises a stiffening structure having a stiffening structure material arranged at the conductive base layer and only partially covering the conductive base layer at the functional region;
wherein the stiffening structure material comprises a silicon material and at least a carbon material;
wherein the stiffening structure material additionally comprises at least one of a nitrogen material, an oxygen material, a titanium material, a molybdenum material and a tantalum material with a material concentration;
wherein the material concentration varies along a thickness direction of the stiffening structure; and
wherein the material concentration varies stepwise along the thickness direction of the stiffening structure.

26. A micro mechanical structure comprising:
a substrate; and
a functional structure arranged at the substrate;
wherein the functional structure comprises a functional region which is deflectable with respect to the substrate responsive to a force acting on the functional region;
wherein the functional structure comprises a conductive base layer;
wherein the functional structure comprises a stiffening structure having a stiffening structure material covering at least partially the conductive base layer;
wherein the stiffening structure material comprises a carbon material comprising a varying carbon concentration along a thickness direction of the stiffening structure; and
wherein the carbon concentration varies stepwise with a plurality of steps.

27. The micro mechanical structure according to claim 26, wherein the stiffening structure material comprises a plurality of concentration values with respect to the carbon concentration along the thickness direction.

28. The micro mechanical structure according to claim 26, wherein the stiffening structure material additionally comprises one of a nitrogen material, an oxygen material, a titanium material, a molybdenum material and a tantalum material with a material concentration.

29. The micro mechanical structure according to claim 28, wherein the material concentration varies along the thickness direction.

30. The micro mechanical structure according to claim 29, wherein the material concentration varies stepwise with a plurality of steps.

31. The micro mechanical structure according to claim 26, wherein a highest hardness of the stiffening structure material is higher than a hardness of a material of the conductive base layer.

32. The micro mechanical structure according to claim 26, wherein a Young's modulus of the stiffening structure material varies with the varying carbon concentration.

33. The micro mechanical structure according to claim 26, wherein a first stiffening structure is arranged at a first surface area of the conductive base layer and wherein a second stiffening structure is arranged at a second surface area of the conductive base layer, the second stiffening structure at least partially covering the conductive base layer, the first surface area opposing the second surface area.

34. The micro mechanical structure according to claim 26, wherein the functional structure is at least a part of a membrane structure and wherein the micro mechanical structure is part of a sound transducer structure.

35. The micro mechanical structure according to claim 26, wherein the stiffening structure is arranged at abutting portions of the functional structure and configured to abut against the substrate when the functional region deflects.

36. The micro mechanical structure according to claim 26, wherein the stiffening structure is configured to set sound transducing characteristics of the micro mechanical structure.

37. A micro mechanical sound transducer comprising the micro mechanical structure according to claim 26.

38. The micro mechanical sound transducer according to claim 37, wherein the micro mechanical sound transducer is a microphone.

39. The micro mechanical sound transducer according to claim 37, wherein the micro mechanical sound transducer is a loudspeaker.

* * * * *